US012676176B2

(12) United States Patent
Hwang et al.

(10) Patent No.: US 12,676,176 B2
(45) Date of Patent: Jul. 7, 2026

(54) MEMORY DEVICE PERFORMING ECS OPERATION, OPERATION METHOD OF THE MEMORY DEVICE, MEMORY SYSTEM, ELECTRONIC DEVICE, AND ELECTRONIC SYSTEM

(71) Applicant: SAMSUNG ELECTRONICS CO., LTD., Suwon-si (KR)

(72) Inventors: Junha Hwang, Suwon-si (KR); Youngbin Lee, Suwon-si (KR); Kangil Kim, Suwon-si (KR); Saemi Song, Suwon-si (KR); Kiseok Oh, Suwon-si (KR); Doohee Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 261 days.

(21) Appl. No.: 18/234,157

(22) Filed: Aug. 15, 2023

(65) Prior Publication Data

US 2024/0161807 A1 May 16, 2024

(30) Foreign Application Priority Data

Nov. 16, 2022 (KR) ........................ 10-2022-0153996

(51) Int. Cl.
*G11C 11/406* (2006.01)
*G11C 29/52* (2006.01)
(52) U.S. Cl.
CPC .. *G11C 11/40622* (2013.01); *G11C 11/40615* (2013.01); *G11C 29/52* (2013.01)
(58) Field of Classification Search
None
See application file for complete search history.

(56) References Cited

U.S. PATENT DOCUMENTS

| | | | |
|---|---|---|---|
| 8,255,772 B1 | 8/2012 | Foley | |
| 8,898,412 B2 | 11/2014 | Hobson et al. | |
| 10,310,935 B2 | 6/2019 | Gao et al. | |
| 10,613,928 B2 | 4/2020 | Kim et al. | |

(Continued)

FOREIGN PATENT DOCUMENTS

| | | |
|---|---|---|
| KR | 10-0123827 B1 | 7/1996 |
| TW | 202223903 A | 6/2022 |

OTHER PUBLICATIONS

Partial European Search Report issued Apr. 26, 2024 by the European Patent Office for EP Patent Application No. 23188654.0.

(Continued)

*Primary Examiner* — Douglas King
(74) *Attorney, Agent, or Firm* — Sughrue Mion, PLLC

(57) ABSTRACT

A memory device is provided. The memory device includes: a memory cell array including a plurality of memory cell rows; a refresh control circuit configured to output a refresh row address to control a refresh operation to be performed on at least one memory cell row among the plurality of memory cell rows; and a control logic circuit configured to receive, from a memory controller, error check and scrub (ECS) setting data corresponding to a mode among a plurality of modes, store the ECS setting data in a mode register, and provide a target row address of a memory cell row to be refreshed to the refresh control circuit based on a value of the ECS setting data in response to a refresh command provided from the memory controller.

7 Claims, 16 Drawing Sheets

(56)             References Cited

U.S. PATENT DOCUMENTS

| | | | |
|---|---|---|---|
| 11,169,730 B2 | 11/2021 | Boehm et al. | |
| 11,195,568 B1 | 12/2021 | Atishay et al. | |
| 2009/0175102 A1* | 7/2009 | Nin | G06F 11/1004 |
| | | | 365/230.06 |
| 2017/0060681 A1* | 3/2017 | Halbert | G06F 3/0679 |
| 2017/0132075 A1* | 5/2017 | Zastrow | G06F 11/1068 |
| 2017/0169875 A1* | 6/2017 | Gans | G11C 11/4074 |
| 2022/0050748 A1 | 2/2022 | Kim et al. | |
| 2022/0068364 A1 | 3/2022 | Ayyapureddi et al. | |
| 2022/0199144 A1 | 6/2022 | Roberts | |
| 2022/0208293 A1 | 6/2022 | Kim et al. | |
| 2022/0293166 A1 | 9/2022 | Ayyapureddi et al. | |
| 2022/0351770 A1 | 11/2022 | Harms et al. | |
| 2023/0015086 A1* | 1/2023 | Ayyapureddi | G11C 29/42 |
| 2023/0176747 A1* | 6/2023 | Mirichigni | G06F 3/0619 |
| | | | 711/154 |

OTHER PUBLICATIONS

Communication dated Mar. 30, 2026, issued by the Taiwanese Patent Office in Taiwanese Application No. 112129212.

* cited by examiner

|  | MODE 1 | MODE 2 | MODE 3 | MODE 4 |
|---|---|---|---|---|
| tECSW | A1 | A2 | A3 | A4 |
| IDD6 COMPARED TO ECS | B1 | B2 | B3 | B4 |
| VDD2L LEVEL | C1 | C2 | C3 | C4 |

MEMORY DEVICE PERFORMING ECS OPERATION, OPERATION METHOD OF THE MEMORY DEVICE, MEMORY SYSTEM, ELECTRONIC DEVICE, AND ELECTRONIC SYSTEM

CROSS-REFERENCE TO RELATED APPLICATION

This application is based on and claims priority under 35 U.S.C. § 119 to Korean Patent Application No. 10-2022-0153996, filed on Nov. 16, 2022, in the Korean Intellectual Property Office, the disclosure of which is incorporated by reference herein in its entirety.

BACKGROUND

The present disclosure relates to an electronic device, and more particularly, to a memory device performing an error check and scrub (ECS) operation, an operation method of the memory device, a memory system, an electronic device, and an electronic system.

Semiconductor memories are widely used to store data in various electronic devices such as computers, wireless communication devices, cameras, digital displays, etc. Data is stored by programming states of a semiconductor memory. To access the stored data, at least one stored state of the semiconductor memory may be read or detected. To store data, components of a device may write or program the state of the semiconductor memory.

Various types of semiconductor memories exist. Volatile memory, such as dynamic random access memory (DRAM), may lose stored data when disconnected from external power. In addition, the state of the semiconductor memory deteriorates over time, which may result in unrecoverable memory errors or other problems.

SUMMARY

One or more embodiments provide a memory device setting an error check and scrub (ECS) setting value according to requirements for each client, an operation method of the memory device, a memory system, an electronic device, and an electronic system.

According to an aspect of an embodiment, a memory device includes: a memory cell array including a plurality of memory cell rows; a refresh control circuit configured to output a refresh row address to control a refresh operation to be performed on at least one memory cell row among the plurality of memory cell rows; and a control logic circuit configured to receive, from a memory controller, error check and scrub (ECS) setting data corresponding to a mode among a plurality of modes, store the ECS setting data in a mode register, and provide a target row address of a memory cell row to be refreshed to the refresh control circuit based on a value of the ECS setting data in response to a refresh command provided from the memory controller.

According to another aspect of an embodiment, an operation of a memory device includes: receiving, from a memory controller, error check and scrub (ECS) setting data corresponding to a mode among a plurality of modes; storing the ECS setting data in a mode register; performing a refresh operation on at least one memory cell row among a plurality of memory cell rows included in a memory cell array, in response to a first refresh command provided from the memory controller; and performing an ECS operation on the at least one memory cell row based on a value of the ECS setting data, in response to a second refresh command provided from the memory controller.

According to another aspect of an embodiment, a memory system includes: a memory controller; and a memory device configured to receive a command and an address from the memory controller through a first channel and transmit and receive data through a second channel. The memory device is further configured to receive a first mode register setting command through the first channel, the first mode register setting command including error check and scrub (ECS) setting data corresponding to a mode determined according to a client among a plurality of modes, and a register write command. The ECS setting data includes a period value indicating an ECS period of an ECS operation performed in a refresh operation of the memory device and a current value related to a refresh current used in the refresh operation.

According to another aspect of an embodiment, an electronic device includes: a processor configured to output error check and scrub (ECS) setting data corresponding to a mode among a plurality of modes; a volatile memory; and a memory controller configured to store the ECS setting data provided from the processor in the volatile memory. The ECS setting data includes a period value indicating an ECS period of an ECS operation performed in a refresh operation of the volatile memory and a current value related to a refresh current used in the refresh operation.

According to another aspect of an embodiment, an electronic system includes: a system-on-chip configured to output a first mode register setting command including error check and scrub (ECS) setting data corresponding to a mode among a plurality of modes; and a memory configured to store the ECS setting data in response to the first mode register setting command. The ECS setting data includes a period value indicating an ECS period of an ECS operation performed in a refresh operation of the memory and a current value related to a refresh current used in the refresh operation.

BRIEF DESCRIPTION OF DRAWINGS

The above and other aspects will be more apparent from the following description of embodiments, taken in conjunction with the accompanying drawings, in which:

FIG. 3 is a diagram illustrating a memory device according to some embodiments;

FIG. 10 is a diagram illustrating ECS setting data according to some embodiments;

DETAILED DESCRIPTION

Hereinafter, embodiments will be described in detail with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
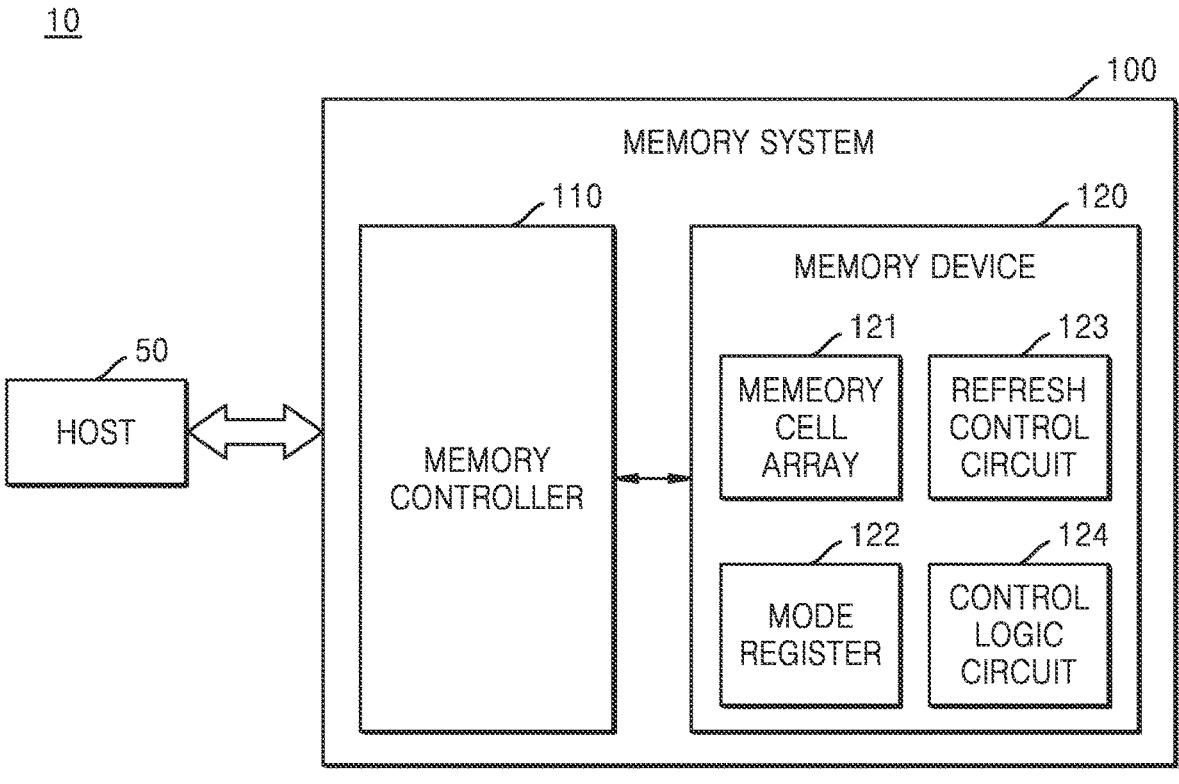
FIG. 1 is a diagram illustrating a system according to some embodiments.

FIG. 1 is a diagram illustrating a system 10 according to some embodiments.

Referring to FIG. 1, the system 10 may include a host 50 and a memory system 100.

The host 50 may be a functional block that performs general computer operations. The host 50 may correspond to a central processing unit (CPU), a digital signal processor (DSP), a graphics processing unit (GPU), a processor, or an application processor (AP).

The host 50 may communicate with the memory system 100 using an interface protocol such as Peripheral Component Interconnect-Express (PCI-E), Advanced Technology Attachment (ATA), Serial ATA (SATA), Parallel ATA (PATA), or serial attached SCSI (SAS). The interface protocol is not limited to the above examples, and may be one of other interface protocols such as Universal Serial Bus (USB), Multi-Media Card (MMC), Enhanced Small Disk Interface (ESDI), or Integrated Drive Electronics (IDE).

The host 50 may issue or generate request signals for accessing the memory system 100. For example, the host 50 may generate data and commands to be stored in the memory system 100 and a logical address corresponding to a physical address indicating a storage space of the memory system 100. For another example, the host 50 may generate data indicating setting values set in the memory system 100 and commands instructing the memory system 100 to store these setting values.

In some embodiments, the host 50 may support an error check and scrub (ECS) mode. When the system 10 is initialized, the host 50 may transmit a request signal requesting to store EC S setting data and the EC S setting data to the memory system 100 in an initialized state. The ECS setting data may include ECS setting values used to perform an ECS operation in the ECS mode. The ECS operation may include operations in which the memory device 120 reads data, corrects an error in the data, and rewrites the corrected data. The ECS setting values may be determined according to clients. Here, the client may be a subject that uses the system 10. The client may be referred to as an enterprise, etc. Because clients have different policies and requirements, an ECS setting value suitable for the policy of each client may be required. Accordingly, when the system 10 is initialized, the host 50 may transmit a request signal requesting to store the ECS setting data determined according to the client to the memory system 100. A specific embodiment of the ECS setting value will be described below with reference to FIG. 10.

In some embodiments, the host 50 may not support the ECS mode. When the system 10 is initialized, the host 50 may not transmit a request signal related to the ECS setting data. In this case, the memory system 100 may perform a refresh operation according to a predetermined refresh period that is set when the memory system 100 is manufactured.

The memory system 100 may store data or provide stored data to the host 50 in response to a request signal from the host 50. The memory system 100 may include a memory controller 110 and a memory device 120.

The memory controller 110 may control overall operations of the memory system 100. The memory controller 110 may control overall data exchange between the host 50 and the memory device 120. For example, the memory controller 110 may control the memory device 120 according to a request of the host 50 to write or read data. Also, the memory controller 110 may issue commands and addresses for controlling the memory device 120. A command and an address may be combined into a command/address signal.

In some embodiments, the memory controller 110 may issue a refresh command to the memory device 120. Here, the refresh command may be a command instructing to perform a refresh operation.

In some embodiments, the memory controller 110 may issue a mode register setting command including the ECS setting data to the memory device 120 in response to a request of the host 50. Here, the mode register setting command may be a command for setting a mode register related to a refresh operation and/or an ECS operation. For example, the mode register setting command may be a mode register set (MRS) command, a mode register read (MRR) command, or a mode register write (MRW) command.

The memory device 120 may store data or output stored data. Such a memory device 120 may be implemented as Dynamic Random Access Memory (DRAM). However, the memory device 120 is not limited thereto. The memory device 120 may be a double data rate synchronous DRAM (DDR SDRAM) according to DDR to DDR6, or LPDDR to LPDDR6, or various standards similar thereto.

Data stored in the memory device 120 may be corrupted due to leakage, parasitic coupling, or electromagnetic interference. Corruption of data may indicate that logic values of data stored in the memory device 120 are unintentionally changed. Deviations between logical values of originally intended data and bit values of the corrupted data may be referred to as data errors or bit errors.

The memory device 120 may correct errors in data when there are errors in stored data. For example, the memory device 120 may correct a 1-bit error. Alternatively, the memory device 120 may detect a 2-bit error. However, embodiments are not limited thereto. Such error detection and correction of data may rely on one or more Error Correction Codes (ECCs) (e.g., block codes, convolution codes, Hamming codes, low-density parity check codes, turbo codes, and polar codes). Error detection and correction performed internally within the memory device 120 may be referred to as on-die ECC. However, embodiments are not limited thereto.

The memory device 120 may perform a refresh operation in response to a refresh command. The refresh operation may include an operation of reading data stored in memory cells (or memory cell rows) corresponding to a refresh row address and an operation of storing (or recharging or writing) the read data again. The memory device 120 may rewrite the same data that is read regardless of a bit error by performing the refresh operation.

The memory device 120 may perform an ECS operation for each ECS period while performing a refresh operation for each refresh period in response to a mode register setting command. For example, the memory device 120 may read stored data through a refresh operation, correct errors in the read data, and store the corrected data again. That is, the ECS operation may be performed as part of or in addition to the refresh operation.

The memory device 120 may include a memory cell array 121, a mode register 122, a refresh control circuit 123, and a control logic circuit 124.

The memory cell array 121 may include a plurality of memory cells. In some embodiments, a plurality of memory cells may be arranged in a plurality of memory cell rows. A memory cell row may include memory cells connected to the same word line.

The mode register 122 may store data related to operating conditions of the memory system 100. The memory controller 110 may issue a mode register setting command, and the issued mode register setting command is stored in the mode register 122, so that an operation mode of the memory system 100 may be set.

The refresh control circuit 123 may output a refresh row address for performing a refresh operation on at least one memory cell row among a plurality of memory cell rows.

The control logic circuit 124 may receive ECS setting data from the memory controller 110 upon initialization. Also, the control logic circuit 124 may store the ECS setting data in the mode register 122. In response to the refresh command provided from the memory controller 110, the control logic circuit 124 may provide the refresh control circuit 123 with a target row address of a memory cell row to be refreshed based on the value of the ECS setting data.

As described above, by setting the ECS setting value according to requirements for each client, there is an effect of improving reliability, availability and serviceability (RAS) of the system 10 or improving power consumption of the system 10.

Figure 2:
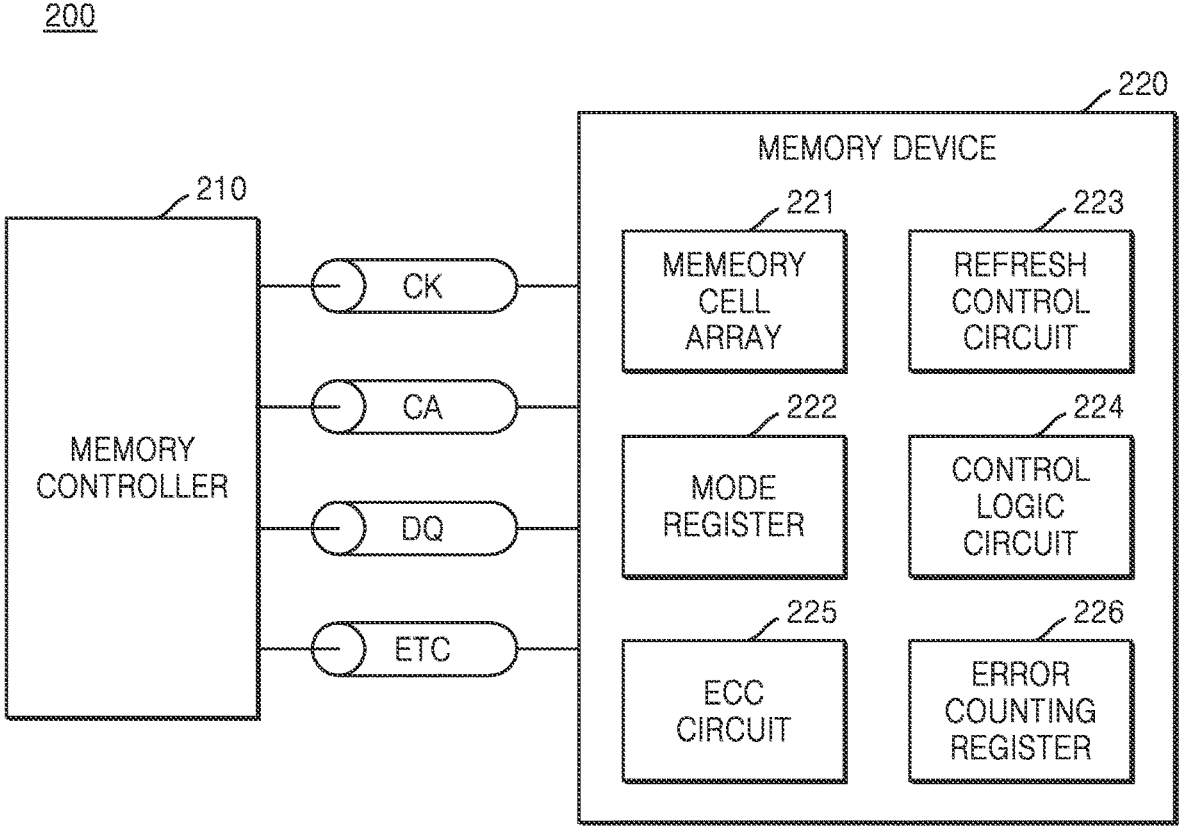
FIG. 2 is a diagram illustrating a memory system according to some embodiments.

FIG. 2 is a diagram illustrating a memory system 200 according to some embodiments.

Referring to FIG. 2, the memory system 200 may correspond to the memory system 100 shown in FIG. 1. The memory system 200 may include a memory controller 210 and a memory device 220.

The memory controller 210 and the memory device 220 may be electrically connected to each other through a clock channel CK, a command/address channel CA, a data channel DQ, and other channels ETC. The channels CK, CA, DQ, and ETC may be dedicated to transferring specific types of information. The channels CK, CA, DQ, and ETC may be implemented according to the DDR standard. For example, the channels CK, CA, DQ, and ETC may satisfy the SDRAM standard determined by the Joint Electron Device Engineering Council (JEDEC).

The clock channel CK may be configured to communicate one or more clock signals between the memory controller 210 and the memory device 220. Each clock signal may oscillate between a high state and a low state. Each clock signal may be configured to coordinate operations of the memory controller 210 and the memory device 220. Each clock signal may provide timing for the operation of the memory device 220.

The command/address channel CA may be configured to communicate commands and addresses between the memory controller 210 and the memory device 220. The commands may include a read command, a write command, a refresh command, a mode register setting command, etc.

The data channel DQ may be configured to communicate data and/or control information between the memory controller 210 and the memory device 220. Here, the control information may include, for example, information indicating the number of that are errors detected and information indicating an ECS setting value. The data channel DQ may be ×4 (e.g., including 4 signal paths), ×8 (e.g., including 8 signal paths), ×16 (e.g., including 16 signal paths), etc. A signal communicated through a channel may be used as a DDR signal. The data channel DQ may be a bi-directional communication channel. The bidirectional communication channel may refer to a channel through which the memory controller 210 may transmit data to the memory device 220 and the memory device 220 may transmit data to the memory controller 210. In a normal mode, main data may be exchanged through the data channel DQ. In the ECS mode, error count data may be transmitted from the memory device 220 to the memory controller 210 through the data channel DQ. In addition, in the ECS mode, address information (e.g., bank address and/or row address) of data in which an error (or referred to as an uncorrected error or fail) has occurred, as well as error count data) may be transmitted from the memory device 220 to the memory controller 210 through the data channel DQ.

The other channels ETC may be, for example, channels that perform functions such as a write clock signal channel and an error detection code channel. The write clock signal channel may be a channel in which a write clock signal providing timing with respect to an operation of the memory device 220 is generated. The error detection code channel may be configured to transfer an error detection signal such as a checksum to improve reliability of the memory system 200.

The memory controller 210 may correspond to the memory controller 110 shown in FIG. 1. The memory device 220 may correspond to the memory device 220 shown in FIG. 1.

The memory controller 210 may generate internal commands (and addresses) for scrubbing each row of the memory cell array 221.

In some embodiments, the memory controller 210 may execute a dynamic voltage frequency scaling (DVFS) mode for controlling operating voltages related to read and write operations of the memory device 220. In this case, the memory controller 210 may control the memory device 220 to execute the DVFS mode. The memory controller 210 may manage operating voltage information related to a read operation and a write operation. When the memory device 220 performs a read operation or a write operation, information about operating voltages may be stored separately for each page of the memory cell array 221. In order to reduce power consumed by the memory system 200 or the memory device 220, the memory controller 210 may analyze the workload of the memory device 220 and execute the DVFS mode at a relatively small workload, thereby reducing the level of the supply voltage supplied to memory device 220.

The memory device 220 may perform an operation of scrubbing the memory cell array 221. A rate at which the ECS operation is performed may correspond to a period in which the memory cell array 221 is scrubbed. To perform the ECS operation, the memory device 220 may receive one or more ECS commands indicating operations of the ECS operation from the memory controller 210. A single ECS operation may correspond to the memory device 220 reading and scrubbing each row of the memory cell array 221. The ECS operation may improve reliability of the memory device 220.

In some embodiments, when the memory system 200 is initialized, the memory device 220 may receive a first mode register setting command through the command/address channel CA. The first mode register setting command may include a register write command and ECS setting data. The register write command may be a command instructing data to be stored in a register. The register write command may be the above-described MRW command.

In some embodiments, the memory device 220 may receive a second mode register setting command through the command/address channel CA after initialization. In response to the second mode register setting command, the memory device 220 may provide error count data indicating the number of occurrences of errors in the main data stored in the memory device 220 and ECS setting data to the memory controller 210 through the data channel DQ. Alternatively, the memory device 220 may provide error count data and ECS setting data to the memory controller 210 through the other channel ETC in response to the second mode register setting command. Here, the second mode register setting command may include a register read command. The register read command may be a command instructing to output the data stored in the register. The register read command may be the above-described MRR command.

In some embodiments, the memory device 220 may receive a third mode register setting command through the command/address channel CA. Here, the third mode register setting command may include a register write command and new ECS setting data. For example, the new ICS setting data may be set according to the number of occurrences of errors. The memory device 220 may store new ECS setting data in the mode register in response to the third mode register setting command.

The memory device 220 may include a memory cell array 221, a mode register 222, a refresh control circuit 223, a control logic circuit 224, an ECC circuit 225, and an error counting register 226.

The memory cell array 221, the mode register 222, the refresh control circuit 223, and the control logic circuit 224 are respectively the same as the memory cell array 121, the mode register 122, the refresh control circuit 123, and the control logic circuit 124 described above with reference to FIG. 1.

The ECC circuit 225 may perform ECC decoding on data read out from the memory cell array 221. The ECC circuit 225 may be implemented to perform an ECS operation in an ECS mode. For example, the ECC circuit 225 may receive data sequentially read from a page corresponding to the received address, correct an error in the read data, and output the corrected data to the memory cell array 110. The ECC circuit 225 may output an error occurrence signal indicating the error in the data to the control logic circuit 224.

In some embodiments, the control logic circuit 224 may count the received error occurrence signal and store error count data indicating the number of occurrences of errors in the error counting register 226. When the number of occurrences of errors is relatively large or greater than a reference number, the memory device 220 may have a relatively low quality state. On the other hand, when the number of occurrences of errors is relatively small or less than or equal to the reference number, the memory device 220 may have a relatively high quality state.

The mode register 222 may store ECS setting data. The error counting register 226 may store error count data.

In some embodiments, the control logic circuit 224 may provide ECS setting data and error count data to the memory controller 210 in response to a register read command received from the memory controller 210. The memory controller 210 may provide ECS setting data and error count data to the outside (e.g., the host 50 shown in FIG. 1). In this case, when the memory system 200 is initialized, new ECS data may be provided to the memory system 200 from the outside (e.g., the host 50 shown in FIG. 1). The new ECS data may include an ECS setting value determined according to the number of occurrences of errors in the previously provided error count data. For example, the new ECS setting data may include a period value indicating an ECS period in which the ECS operation is performed in a refresh operation and a current value related to a refresh current used in the refresh operation, and the period value and the current value may change according to the number of occurrences of errors.

In some embodiments, the control logic circuit 224 may provide ECS setting data, error count data, and an address to the memory controller 210 in response to a register read command received from the memory controller 210. Here, the address may indicate pages storing data in which an error (or an uncorrectable error) has occurred.

In some embodiments, the memory controller 210 may provide a mode register setting command (e.g., a register write command) to the memory device 220 to store the new ECS data. The control logic circuit 224 may receive new ECS setting data from the memory controller 210. Then, the control logic circuit 224 may store the new ECS setting data in the mode register 222.

Figure 3:
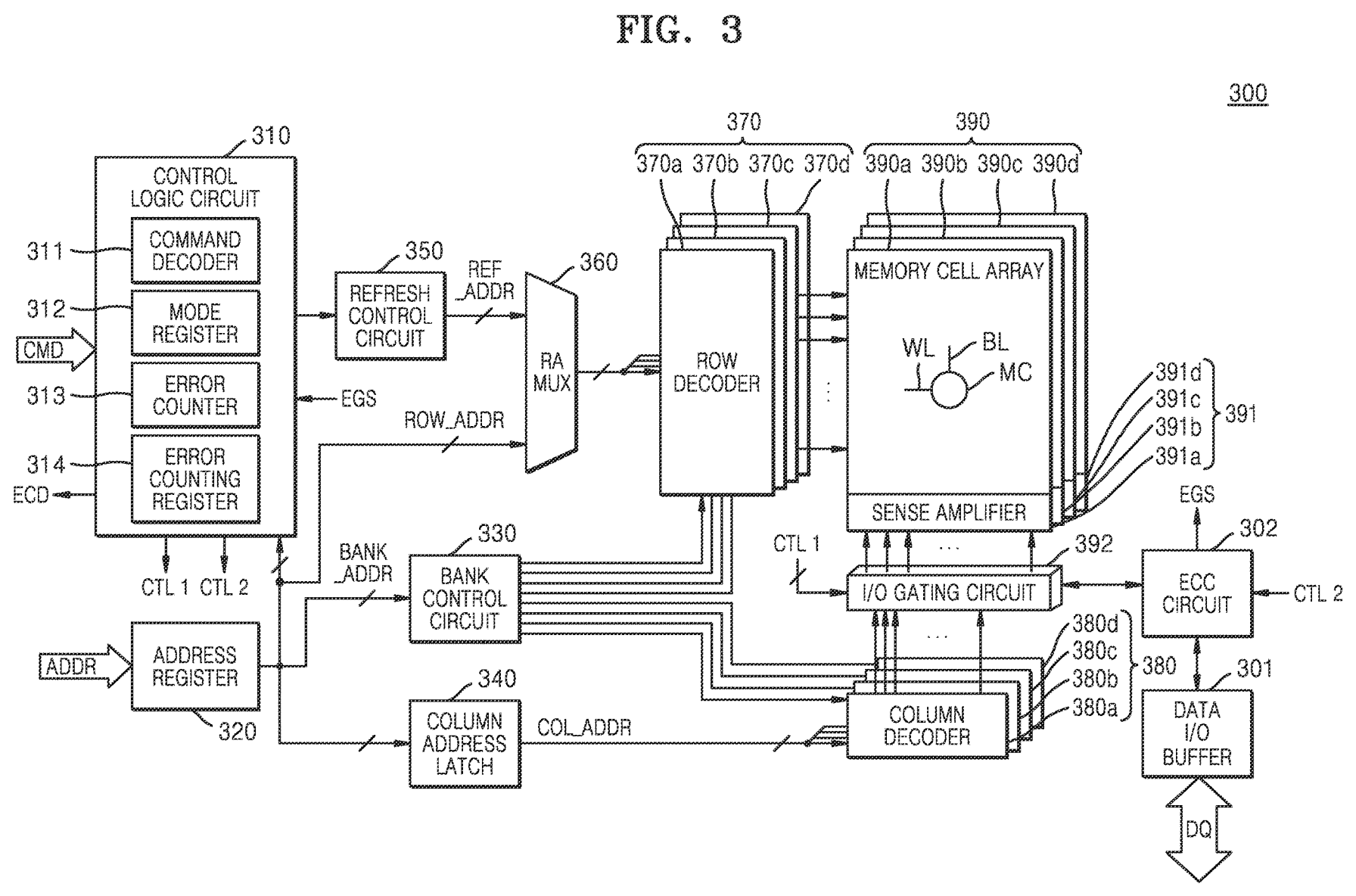

FIG. 3 is a diagram illustrating a memory device 300 according to some embodiments.

Referring to FIG. 3, the memory device 300 may correspond to each of the memory devices 120 and 220 respectively shown in FIGS. 1 and 2. The memory device 300 may include a control logic circuit 310, an address register 320, a bank control circuit 330, a column address latch 340, a refresh control circuit 350, a row address multiplexer 360, a row decoder 370, a column decoder 380, a memory cell array 390, a sense amplifier 391, an input/output gating circuit 392, a data input/output buffer 301, and an ECC circuit 302.

The memory cell array 390 may include first to fourth bank arrays 390a to 390d. Each of the first to fourth bank arrays 390a to 390d may include a memory cell MC formed at a point where a word line WL and a bit line BL cross each other. The number of memory cells MC may be plural. Each of the first to fourth bank arrays 390a to 390d may include a plurality of pages including memory cell rows connected to respective word lines WL.

The row decoder 370 may include first to fourth bank row decoders 370a to 370d respectively connected to the first to fourth bank arrays 390a to 390d.

The column decoder 380 may include first to fourth bank column decoders 380a to 380d respectively connected to the first to fourth bank arrays 390a to 390d.

The sense amplifier 391 may include first to fourth bank sense amplifiers 391a to 391d respectively connected to the first to fourth bank arrays 390a to 390d.

The first to fourth bank arrays 390a to 390d, the first to fourth bank sense amplifiers 391a to 391d, the first to fourth bank column decoders 380a to 380d, and the first to fourth bank row decoders 370a to 370d may configure first to fourth banks, respectively. FIG. 3 illustrates the memory cell array 390 including four banks, but is not limited thereto. According to an embodiment, the memory cell array 390 may include any number of banks.

The address register 320 may receive an address ADDR including a bank address BANK_ADDR, a row address ROW_ADDR, and a column address COL_ADDR. The address register 320 may provide the address ADDR to the control logic circuit 310. The address register 320 may provide the bank address BANK_ADDR to the bank control circuit 330. The address register 320 may provide the row address ROW_ADDR to the row address multiplexer 360. The address register 320 may provide the column address COL_ADDR to the column address latch 340.

The bank control circuit 330 may generate bank control signals in response to the bank address BANK_ADDR. The bank control signals may be provided to the first to fourth bank row decoders 370a to 370d and the first to fourth bank column decoders 380a to 380d. Among the first to fourth bank row decoders 370a to 370d, a bank row decoder corresponding to the bank address BANK_ADDR may be activated. Among the first to fourth bank column decoders 380a to 380d, a bank column decoder corresponding to the bank address BANK_ADDR may be activated.

The refresh control circuit 350 may generate a refresh row address REF_ADDR for refreshing a plurality of memory cell rows included in the memory cell array 390 under the control of the control logic circuit 310. The refresh control circuit 350 may be included in the memory device 300 when the memory cells MC of the memory cell array 390 include dynamic memory cells.

The row address multiplexer 360 may receive the row address ROW_ADDR from the address register 320 and receive the refresh row address REF_ADDR from the refresh control circuit 350. The row address multiplexer 360 may selectively output the row address ROW_ADDR or the refresh row address REF_ADDR as a row address. The row address may be applied to each of the first to fourth bank row decoders 370a to 370d.

A bank row decoder activated by the bank control circuit 330 among the first to fourth bank row decoders 370a to 370d may decode the row address output from the row address multiplexer 360 and activate a word line corresponding to the row address. For example, the activated bank row decoder may apply a word line driving voltage to the word line corresponding to the row address.

The column address latch 340 may receive the column address COL_ADDR from the address register 320 and temporarily store the received column address COL_ADDR. Also, the column address latch 340 may gradually increase the received column address COL_ADDR in a burst mode. The column address latch 340 may apply the temporarily stored or gradually increased column address COL_ADDR to each of the first to fourth bank column decoders 380a to 380d.

Among the first to fourth bank column decoders 380a to 380d, the bank column decoder activated by the bank control circuit 330 may activate the sense amplifier that corresponds to the bank address BANK_ADDR and the column address COL_ADDR through the input/output gating circuit 392.

The input/output gating circuit 392 may include data gating circuits, input data mask logic, data latches, and write drivers.

The data input/output buffer 301 may provide main data received through the data channel DQ to the ECC circuit 302 in a write operation, and provide main data provided from the ECC circuit 302 to the memory controller 110 in a read operation.

In a write operation, the ECC circuit 302 may generate parity data based on main data provided from the data input/output buffer 301. Also, the ECC circuit 302 may provide a codeword including main data and parity data to the input/output gating circuit 392. At this time, the input/output gating circuit 392 may transmit the codeword to an activated bank array.

In the read operation, the ECC circuit 302 may receive a codeword read from one bank array from the input/output gating circuit 392. Also, the ECC circuit 302 may perform decoding on the main data based on the parity data included in the codeword. In addition, the ECC circuit 302 may correct an error of a single-bit (or 1-bit) included in the main data and provide the corrected bit to the data input/output buffer 301.

In the ECS mode, the ECC circuit 302 may perform ECC decoding on the codeword including main data and parity data from each of a plurality of subpages included in each of some pages of the memory cell array 390. When an error is included in the codeword, the ECC circuit 302 may provide an error occurrence signal EGS to the control logic circuit 310. Also, when an error is included in the codeword, the ECC circuit 302 may perform an ECS operation of correcting the error and rewriting the corrected codeword to a corresponding subpage.

The control logic circuit 310 may control overall operations of the memory device 300. For example, the control logic circuit 310 may generate control signals instructing to perform a write operation or a read operation.

The control logic circuit 310 may include a command decoder 311, a mode register 312, an error counter 313, and an error counting register 314.

The command decoder 311 may decode a command CMD received from the outside (e.g., the memory controller 210 described above with reference to FIG. 2). For example, the command decoder 311 may decode a write enable signal /WE, a row address strobe signal /RAS, a column address strobe signal /CAS, a chip select signal /CS, etc., to generate control signals corresponding to the command CMD. The command decoder 311 may decode the command CMD to generate a first control signal CTL1 for controlling the input/output gating circuit 392 and a second control signal CTL2 for controlling the ECC circuit 302.

The mode register 312 may store data for setting an operation mode of the memory device 300. In some embodiments, the mode register 312 may further store ECS setting data.

The error counter 313 may count the error occurrence signal EGS provided from the ECC circuit 302. The error counter 313 may count the error occurrence signal EGS and store the error count data ECD in the error counting register 314.

When the command CMD indicates the ECS mode, the control logic circuit 310 may generate the first control signal CTL1 and the second control signal CTL2 so that the input/output gating circuit 392 and the ECC circuit 302 perform an ECS operation. In some embodiments, when the command CMD is a refresh command in the ECS mode, the control logic circuit 310 may generate the first control signal CTL1 and the second control signal CTL2 to perform a refresh operation on a single row for each refresh command. Also, whenever a specific number of refresh commands are input to the control logic circuit 310, the control logic circuit 310 may generate the first control signal CTL1 and the second control signal CTL2 to perform the ECS operation. Here, the number of refresh commands for initiating the ECS operation (i.e., the specific number of refresh commands) may be determined according to ECS setting data. An embodiment in which an ECS operation is performed whenever a specific number of refresh commands are provided will be described below with reference to FIG. 8.

In some embodiments, when the command CMD is an MRR command, the control logic circuit 310 may output the error count data ECD and ECS setting data. The control logic circuit 310 may store addresses (e.g., the bank address BANK_ADDR and/or the row address ROW_ADDR) of some pages in which data in which an error (or an uncorrectable error) has occurred is stored in response to the error occurrence signal EGS. In addition, when the command CMD is the MRR command in the ECS mode, the control logic circuit 310 may also output the error count data ECD and the ECS setting data as well as addresses (e.g., the bank address BANK_ADDR and/or the row address ROW_ADDR).

In some embodiments, when a DVFS mode is executed, a refresh current for performing an ECS operation, a current required for performing an operation for correcting a codeword error, etc., need to be reduced. In this case, when the level of the supply voltage supplied to the memory device 300 is reduced in the DVFS mode, the control logic circuit 310 may reduce the magnitudes of the above-described currents in response to the reduced level of the supply voltage, and control the refresh control circuit 350, the ECC circuit 302, and the input/output gating circuit 392 to perform a refresh operation and/or an ECS operation based on the reduced current.

Figure 4:
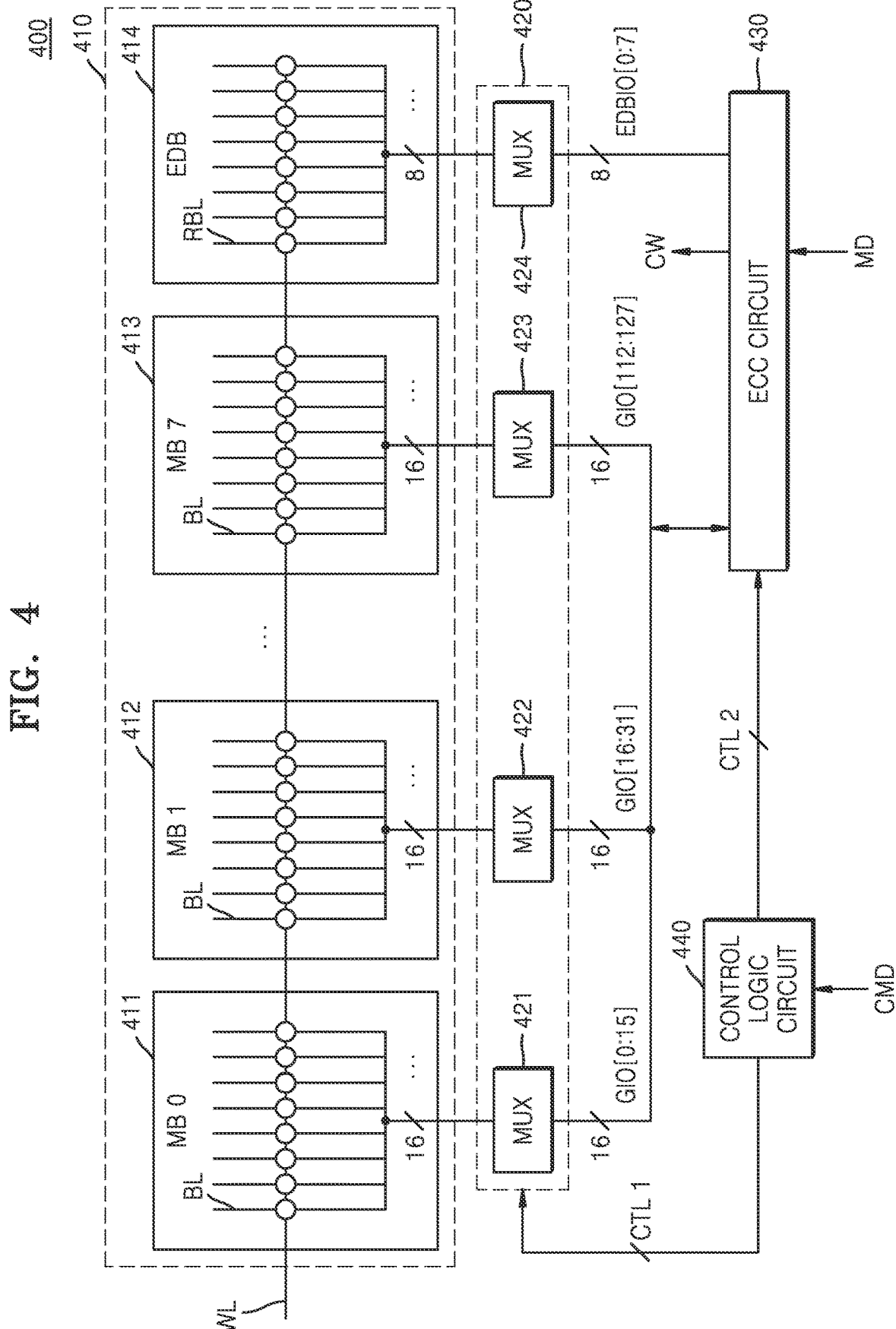
FIG. 4 is a diagram illustrating a part of a memory device in a normal mode.

FIG. 4 is a diagram illustrating a memory device 400 operating in a normal mode. Specifically, FIG. 4 is a diagram illustrating a write operation of the memory device 400 in a normal mode.

Referring to FIG. 4, the memory device 400 includes a bank array 410, an input/output gating circuit 420, an ECC circuit 430, and a control logic circuit 440.

The bank array 410 may include a plurality of memory blocks 411 to 413 and at least one repair memory block 414.

The number and size of the plurality of memory blocks 411 to 413 may determine the storage capacity of the memory device 400. The plurality of memory blocks 411 to 413 may include a plurality of memory cells arranged in rows and columns. For example, rows of each of the plurality of memory blocks 411 to 413 may include 8K word lines WL. Columns of each of the plurality of memory blocks 411 to 413 may include 1K bit lines BL. The plurality of memory blocks 411 to 413 may be included in a normal cell array.

A repair memory block 414 may be a block for repairing defective memory cells generated in the plurality of memory blocks 411 to 413. The repair memory block 414 may include a plurality of memory cells arranged in rows and columns. For example, rows of the repair memory block 414 may include 8K word lines WL. Columns of the repair memory block 414 may include 1K repair bit lines (RBLs). The repair memory block 414 may be included in a redundancy cell array.

The input/output gating circuit 290 may include a plurality of selectors 421 to 424 respectively connected to the plurality of memory blocks 411 to 413 and the repair memory block 414. In order for the memory device 400 to support a burst length, bit lines BL corresponding to the burst length may be simultaneously accessed. For example, the burst length may be set to 16 in the memory device 400.

The ECC circuit 430 may be connected to the plurality of selectors 421 to 424 through a plurality of first data lines GIO[0:15], GIO[16:31], and GIO[112:127] and second data lines EDBIO[0:7].

The control logic circuit 440 may decode the command CMD to obtain the first control signal CTL1 and the second control signal CTL2, provide the first control signal CTL1 to the input/output gating circuit 420, and provide the second control signal CTL2 to the ECC circuit 430.

When the command CMD is a write command, the ECC circuit 430 may encode the main data MD to generate a codeword CW including the main data MD and parity data. The control logic circuit 440 may control the main data MD to be stored in each of the plurality of memory blocks 411 to 413, and the parity data to be stored in the repair memory block 414.

Figure 5:
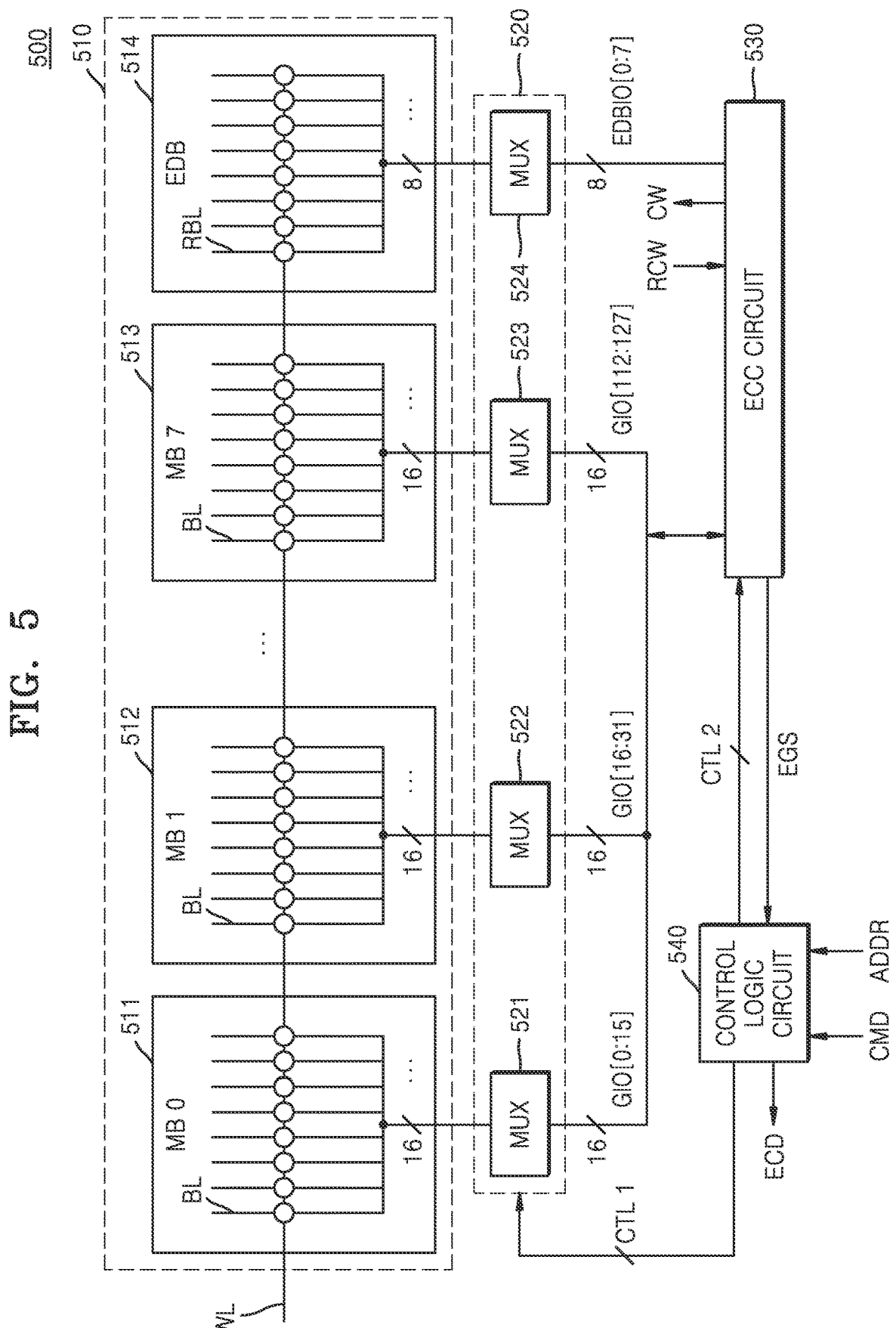
FIG. 5 is a diagram illustrating a part of a memory device in an error check and scrub (ECS) mode.

FIG. 5 is a diagram illustrating a memory device 500 operating in an ECS mode. Specifically, FIG. 5 is a diagram illustrating an ECS operation of the memory device 500 in the ECS mode.

Referring to FIG. 5, the memory device 500 may include a bank array 510, an input/output gating circuit 520, an ECC circuit 530, and a control logic circuit 540. Among the descriptions of the bank array 510, the input/output gating circuit 520, the ECC circuit 530, and the control logic circuit 540, the same ones as described above with reference to FIG. 4 are omitted.

When the command CMD indicates the ECS mode, the control logic circuit 540 may provide the first control signal CTL1 and the second control signal CTL2 to the input/output gating circuit 520 and the ECC circuit 530 to read a read codeword RCW from each of subpages of the bank array 510 and perform ECC decoding. The subpage may include each of some pages of the bank array 510 designated by the address ADDR. The read codeword RCW may include main data and parity data.

After performing ECC decoding on the read codeword RCW, when the read codeword RCW includes an error, the ECC circuit 530 may transmit the error occurrence signal EGS to the control logic circuit 540.

When the read codeword RCW includes an error, the control logic circuit 540 may control the ECC circuit 530 to correct the error of the read codeword RCW and rewrite a corrected codeword CCW to the corresponding subpage. The ECC circuit 530 may read a codeword from a specific subpage and perform ECC decoding on the read codeword RCW. When the read codeword RCW includes an error, the ECC circuit 530 may correct the error of the read codeword RCW and rewrite the corrected codeword CCW to the corresponding subpage. The control logic circuit 540 may count the error occurrence signal EGS and store error counting data ECD indicating the number of occurrences of errors with respect to each of some pages.

In some embodiments, when the command CMD is an MRR command, the control logic circuit 540 may output the error counting data ECD and ECS setting data.

Figure 6:
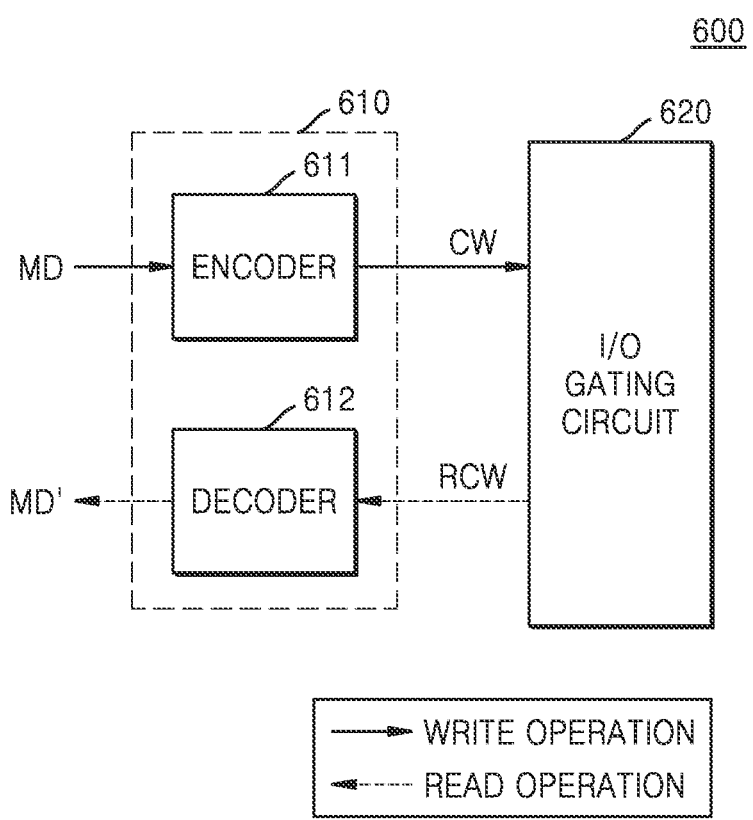
FIG. 6 is a diagram illustrating a normal operation of a memory device according to some embodiments.

FIG. 6 is a diagram illustrating a normal operation of a memory device 600 according to some embodiments.

Referring to FIG. 6, the normal operation may include, for example, a write operation and a read operation.

In the write operation, the ECC circuit 610 may generate the codeword CW based on the main data MD and provide the codeword CW to an input/output gating circuit 620. For example, an encoder 611 included in the ECC circuit 610 may generate parity data with respect to the main data MD using the main data MD. Also, the encoder 611 may encode the codeword CW including the main data MD and parity data. The codeword CW may be written to one bank array through write drivers included in an input/output gating circuit 620.

In the read operation, the input/output gating circuit 620 may provide an ECC decoder 612 with the read codeword RCW from a subpage of one bank array. The ECC decoder 612 may correct an error included in the read codeword RCW using parity data of the read codeword RCW and output corrected main data MD'.

In the refresh operation, the read codeword RCW may be provided to the input/output gating circuit 620 again as the codeword CW.

Figure 7:
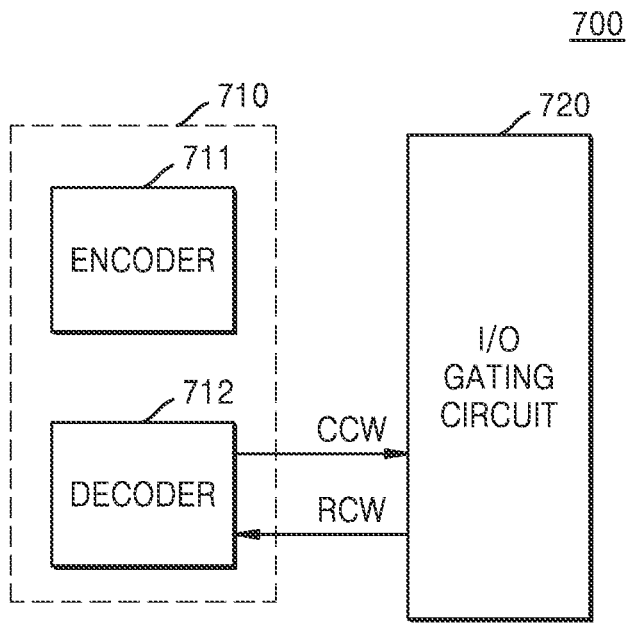
FIG. 7 is a diagram illustrating an ECS operation of a memory device according to some embodiments.

FIG. 7 is a diagram illustrating an ECS operation of a memory device 700 according to some embodiments.

In an ECS operation, an input/output gating circuit 720 may provide an ECC decoder 712 with the read codeword RCW from a subpage of one bank array.

The ECC decoder 712 may correct an error of the read codeword RCW using parity data of the read codeword RCW and provide the corrected codeword CCW to the input/output gating circuit 720.

The input/output gating circuit 720 may receive the corrected codeword CCW from the ECC decoder 712 and rewrite the corrected codeword CCW to a corresponding subpage.

The ECC circuit 710 may provide the error occurrence signal EGS to a control logic circuit whenever an error occurs in the read codeword RCW while performing the ECS operation.

Figure 8:
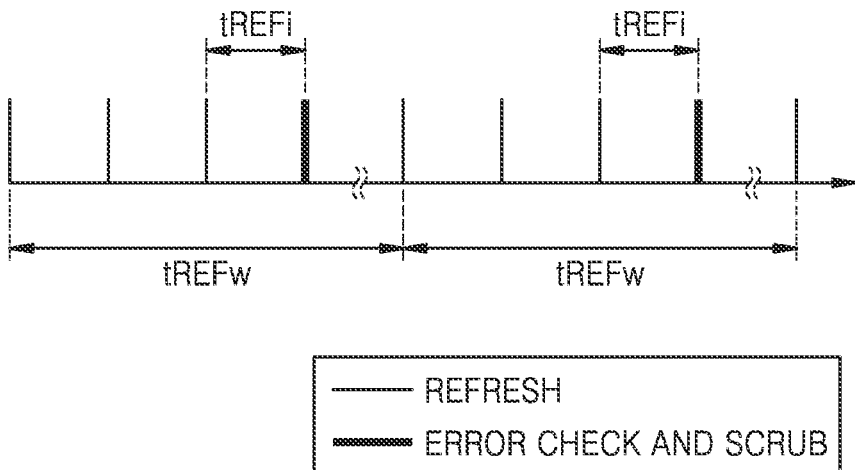
FIG. 8 is a diagram illustrating timing of a refresh operation and an ECS operation according to some embodiments.

FIG. 8 is a diagram illustrating timing of a refresh operation and an ECS operation according to some embodiments.

Referring to FIG. 8, a 32 ms or 64 ms refresh window time tREFw defined in the JEDEC standard may be set. Within one refresh window time tREFw, refresh commands may be issued at intervals of a basic refresh rate time tREFi. As the refresh command is issued, a refresh operation REFRESH may be performed.

In some embodiments, whenever a specific number of refresh commands are issued in an ECS mode, the ECS operation ERROR CHECK AND SCRUB described above may be performed. Referring to FIG. 8, for example, the specific number of refresh commands may be four. In this case, when a fourth refresh command is issued after three refresh commands are issued, the ECS operation ERROR CHECK AND SCRUB may be performed. However, embodiments are not limited thereto. In some embodiments, the specific number of refresh commands may be eight. In this case, whenever an eighth refresh command is issued, the ECS operation ERROR CHECK AND SCRUB may be performed. Alternatively, the specific number of refresh commands may be 16. In this case, whenever a 16th refresh command is issued, the ECS operation ERROR CHECK AND SCRUB may be performed.

As described above, the timing of the ECS operation ERROR CHECK AND SCRUB performed whenever a specific number of refresh commands are issued may be determined according to ECS setting data.

Figure 9:
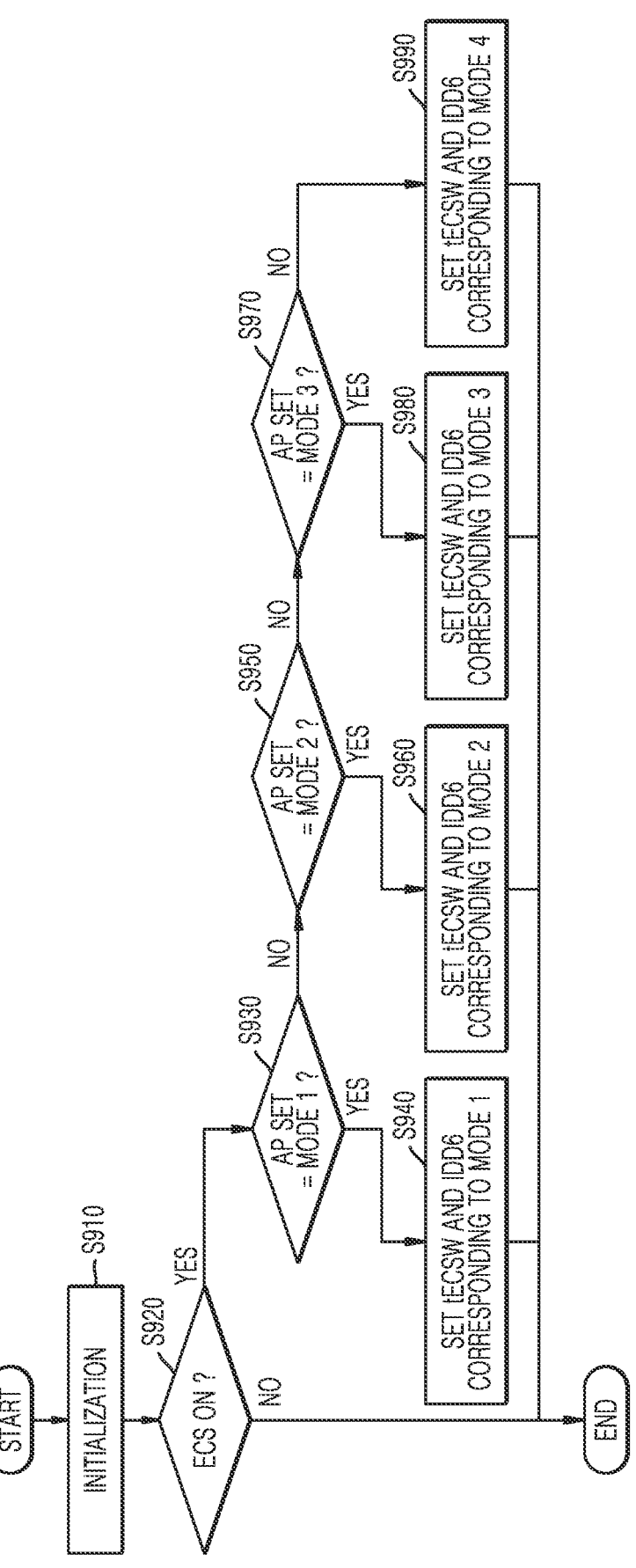
FIG. 9 is a flowchart illustrating a method of setting ECS setting values according to some embodiments.

FIG. 9 is a flowchart illustrating a method of setting ECS setting values according to some embodiments. FIG. 10 is a diagram illustrating ECS setting data according to some embodiments.

The method shown in FIG. 9 may be, for example, a method performed by the host 50 shown in FIG. 1.

Referring to FIG. 9, initialization proceeds in operation S910. Referring to FIG. 1, for example, the system 10 may be initialized.

In operation S920, it is determined whether an ECS is turned on. Referring to FIG. 1, for example, it may be determined whether the host 50 supports an ECS mode according to the requirements of a client using the system 10. Information about whether the ECS mode is supported may be previously stored in the host 50. When the system 10 is implemented as a device requiring monitoring, such as a server, it may be determined that the ECS is turned on.

When the ECS is turned off (S920, NO), the ECS setting value required for the ECS operation may be determined as a default value without being changed. Basic values may be, for example, "A3", "B3", and "C3" corresponding to a mode 3 MODE 3 with reference to FIG. 10. However, embodiments are not limited thereto. When the system 10 is implemented as a device that does not require monitoring, such as a mobile phone, a smart phone, a tablet personal computer (PC), or a wearable device, it may be determined that the ECS is turned off.

Referring to FIG. 10, ECS setting data may include a period value indicating an ECS period tECSW during which an ECS operation is performed in a refresh operation and a current value related to a the refresh current IDD6 used in the refresh operation. The ECS setting data may further include a level of supply voltage VDD2L LEVEL supplied to the memory device (e.g., 120) in DVFS. The refresh current IDD6 may be referred to as an auto self-refresh current according to DRAM specifications. As shown in FIGS. 9 and 10, there may be a plurality of types of modes, and the number of types of modes is 4 in FIGS. 9 and 10.

When the ECS is turned on (S920, YES), in operation S930, it is determined whether an application processor set AP SET is a mode 1 MODE 1. Referring to FIG. 1, for example, the host 50 may determine whether the system 10 supports the mode 1 MODE 1. For another example with reference to FIG. 1, the host 50 may determine whether the ECS setting value needs to be set to a value corresponding to mode 1 MODE 1.

When the application processor set AP SET is mode 1 MODE 1 (S930, YES), in operation S940, the host 50 may set the ECS period tECSW and the refresh current IDD6 corresponding to the mode 1 MODE 1. In some embodiments, the host 50 may further set a level of supply voltage VDD2L LEVEL corresponding to the mode 1 MODE 1. Referring to FIG. 10, for example, when the system 10 supports mode 1 MODE 1, a period value indicating the ECS period tECSW, a current value with respect to the refresh current IDD6, and the level of supply voltage VDD2L LEVEL may be "A1", "B1", and "C1", respectively.

When the application processor set AP SET is not the mode 1 MODE 1 (S930, NO), in operation S950, it is determined whether the application processor set AP SET is the mode 2 MODE 2.

When the application processor set AP SET is the mode 2 MODE 2 (S950, YES), in operation S960, the host 50 may set the ECS period (tECSW) and the refresh current IDD6 corresponding to the mode 2 MODE 2. In some embodiments, the host 50 may further set the level of the supply voltage VDD2L LEVEL corresponding to the mode 2 MODE 2. Referring to FIG. 10, for example, when the system 10 supports the mode 2 MODE 2, a period value indicating the ECS period tECSW, a current value with respect to the refresh current IDD6, and the level of supply voltage VDD2L LEVEL may be "A2", "B2", and "C2", respectively.

When the application processor set AP SET is not the mode 2 MODE 2 (S950, NO), in operation S970, it is determined whether the application processor set AP SET is a mode 3 MODE 3.

When the application processor set AP SET is the mode 3 MODE 3 (S970, YES), in operation S980, the host 50 may set the ECS period tECSW and the refresh current IDD6 corresponding to the mode 3 MODE 3. In some embodiments, the host 50 may further set the level of supply voltage VDD2L LEVEL corresponding to the mode 3 MODE 3. Referring to FIG. 10, for example, when the system 10 supports the mode 3 MODE 3, a period value indicating the ECS period tECSW, a current value with respect to the refresh current IDD6, and the level of supply voltage VDD2L LEVEL may be "A3", "B3", and "C3", respectively.

When the application processor set AP SET is not the mode 3 MODE 3 (S970, NO), in operation S990, it is determined that the application processor set AP SET is a mode 4 MODE 4. Also, the host 50 may set the ECS period tECSW and the refresh current IDD6 corresponding to the mode 4 MODE 4. In some embodiments, the host 50 may further set the level of supply voltage VDD2L LEVEL corresponding to the mode 4 MODE 4. Referring to FIG. 10, for example, when the system 10 supports the mode 4 MODE 4, a period value indicating an ECS period tECSW, a current value with respect to the refresh current IDD6, and the level of supply voltage VDD2L LEVEL may be "A4", "B4", and "C4", respectively.

Referring to FIG. 10, the current value of the refresh current IDD6 according to some embodiments may represent a limit value under the condition that a difference between the refresh current IDD6 when only the refresh operation is performed and the refresh current IDD6 when a part of the refresh operation or an ECS operation is performed in addition to the refresh operation is within a certain percentage %. Here, the refresh current IDD6 when only the refresh operation is performed without the ECS operation may be smaller than the refresh current IDD6 when an ECS operation is performed as a part of the refresh operation or the ECS operation is performed in addition to the refresh operation. Referring to FIG. 10, for example, in mode 1 MODE 1, the difference in the refresh current between when only the refresh operation is performed without the ECS operation and when the ECS operation is performed in addition to the refresh operation may be within "B1" %.

When the number of occurrences of errors is relatively large or greater than a reference number, the memory device 220 may have a relatively low quality state. When the quality of the memory device 120 is relatively low or is less than the reference number, the ECS period tECSW may be reduced in order to increase the quality of the memory device 120. When the ECS period tECSW is reduced, because the ECS operation is performed relatively more frequently, the current value of the refresh current IDD6 may be relatively decreased. As described above, when the current value of the refresh current IDD6 according to some embodiments is the limit value limiting a difference between when only the refresh operation is performed and when the refresh operation and the ECS operation are performed at a certain rate value, the rate to be limited may increase (in order to reduce the refresh current IDD6 itself).

On the other hand, when the number of occurrences of errors is relatively small or less than or equal to the reference number, the memory device 220 may have a relatively high quality state. When the quality of the memory device 120 is relatively high, the ECS period tECSW may increase in order to reduce power consumed by the memory device 120. When the ECS period tECSW increases, because the ECS operation is relatively less frequently performed, the current value of the refresh current IDD6 may relatively increase. In some embodiments, when the current value of the refresh current IDD6 according to some embodiments is the limit value limiting a difference between when only the refresh operation is performed and when the refresh operation and the ECS operation are performed at a certain rate value, the rate to be limited may decrease.

Because the ECS setting values corresponding to the modes 1 to 4 MODE 1 to MODE 4 shown in FIGS. 9 and 10 are set to values required for each client, the ECS setting values according to each mode may be different. For example, a first period value A1 included in the first ECS setting data with respect to the mode 1 MODE 1 may be less than a second period value A2 included in the second ECS setting data with respect to the mode 2 MODE 2. In this case, a first current value B1 included in the first ECS setting data may be greater than a second current value B2 included in the second ECS setting data. In some embodiments, when the current value of the refresh current IDD6 according to some embodiments is expressed in the rate described above, "B1" % may be smaller than "B2" %. Conversely, the first period value A1 included in the first ECS setting data with respect to the mode 1 MODE 1 may be greater than the second period value A2 included in the second ECS setting data with respect to the mode 2 MODE 2. In this case, the first current value B1 may be less than the second current value B2. In some embodiments, when the current value of the refresh current IDD6 according to some embodiments is expressed in the rate described above, "B1" % may be greater than "B2" %.

As described above, in an embodiment, when the first to fourth period values A1 to A4 sequentially increase (e.g., when the first period value A1 is the smallest and the fourth period value A4 is the largest), the first to fourth current values B1 to B4 may be sequentially reduced. In this case, in terms of RAS coverage of the system 10, the RAS of the system 10 to which the mode 1 Mode 1 is applied may be the highest, and the RAS of the system 10 to which the mode 4 Mode 4 is applied may be the lowest. However, in terms of efficiency of power consumption consumed in the memory system 100, the efficiency of power consumption consumed by the memory system 100 to which the mode 4 Mode 4 is applied is the highest, and the efficiency of power consumption consumed by the memory system 100 to which the mode 1 Mode 1 may be the lowest.

The ECS setting data shown in FIG. 10 may be included in an operating code of the MRS command or an operating code of the MRW command. The operating code may be, for example, 8 bits.

Figure 11:
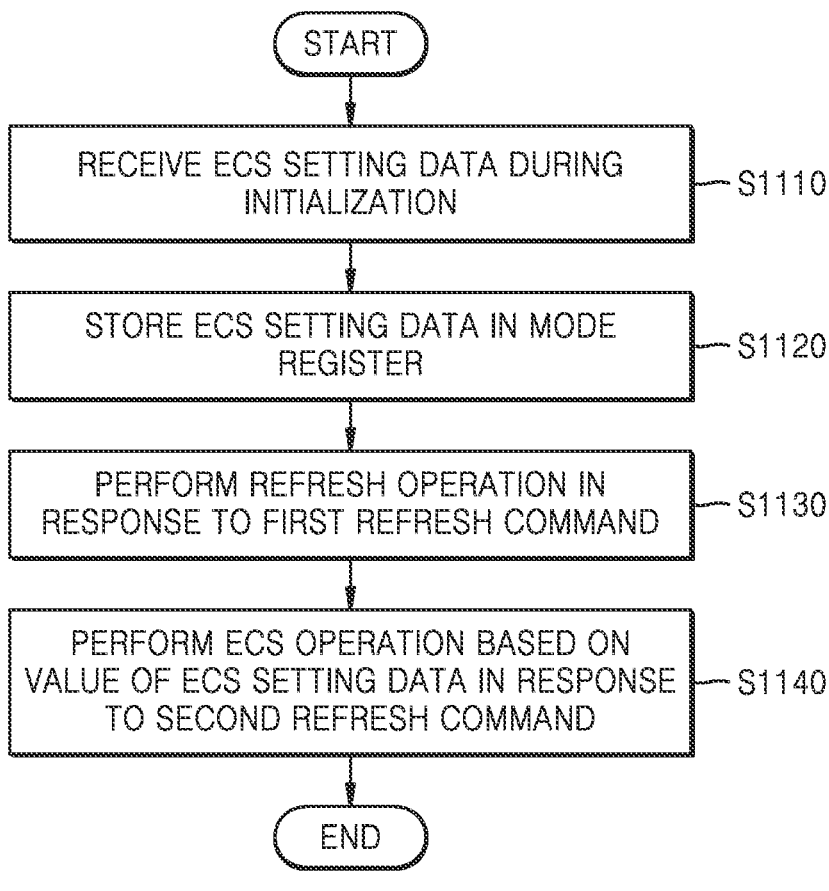
FIG. 11 is a flowchart illustrating an operation method of a memory device according to an embodiment.

FIG. 11 is a flowchart illustrating an operation method of a memory device according to an embodiment.

Referring to FIGS. 1, 10, and 11, an operation of receiving ECS setting data corresponding to a mode determined according to a client among a plurality of modes MODE 1 to MODE 4 from the memory controller 110 during initialization is performed (S1110).

In some embodiments, the ECS setting data may include a period value indicating the ECS period tECSW and a current value related to the refresh current IDD6. The ECS setting data may further include the level of supply voltage VDD2L LEVEL of DVFS.

In an embodiment, a first period value included in first ECS setting data may be smaller than a second period value included in second ECS setting data, and a first current value included in the first ECS setting data may be greater than a second current value included in the second ECS setting data.

In another embodiment, the first period value included in the first ECS setting data may be greater than the second period value included in the second ECS setting data, and the first current value included in the first ECS setting data may be less than the second current value included in the second ECS setting data.

An operation of storing the ECS setting data in the mode register 1222 is performed (S1120).

An operation of performing a refresh operation on at least one memory cell row among a plurality of memory cell rows included in the memory cell array 121 is performed in response to a first refresh command provided from the memory controller 110 (S1130).

An operation of performing an ECS operation on at least one memory cell row based on a value of ECS setting data is performed in response to a second refresh command provided from the memory controller 110 (S1140).

Figure 12:
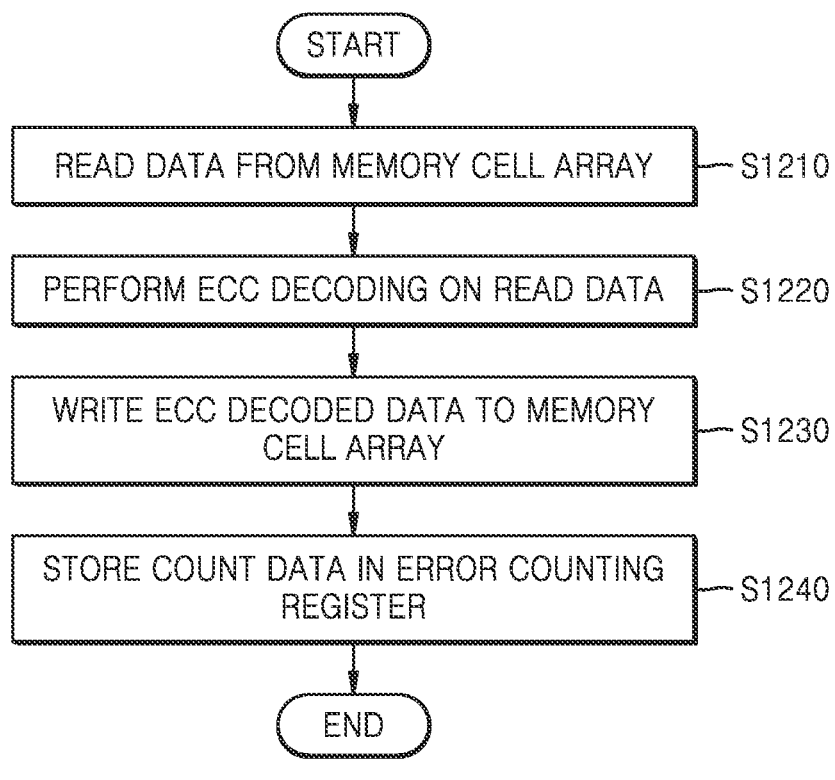
FIG. 12 is a flowchart specifically illustrating an operation of performing the ECS operation shown in FIG. 11.

FIG. 12 is a flowchart specifically illustrating an operation of performing the ECS operation shown in FIG. 11.

Referring to FIGS. 2 and 12, an operation of reading data from the memory cell array 221 is performed (S1210).

An operation of performing ECC decoding on the data read from the memory cell array 221 is performed (S1220).

An operation of writing the ECC decoded data to the memory cell array 221 is performed (S1230).

An operation of storing count data indicating the number of occurrences of errors in the error counting register 226 is performed (S1240). Here, the count data may be the error count data ECD.

Figure 13:
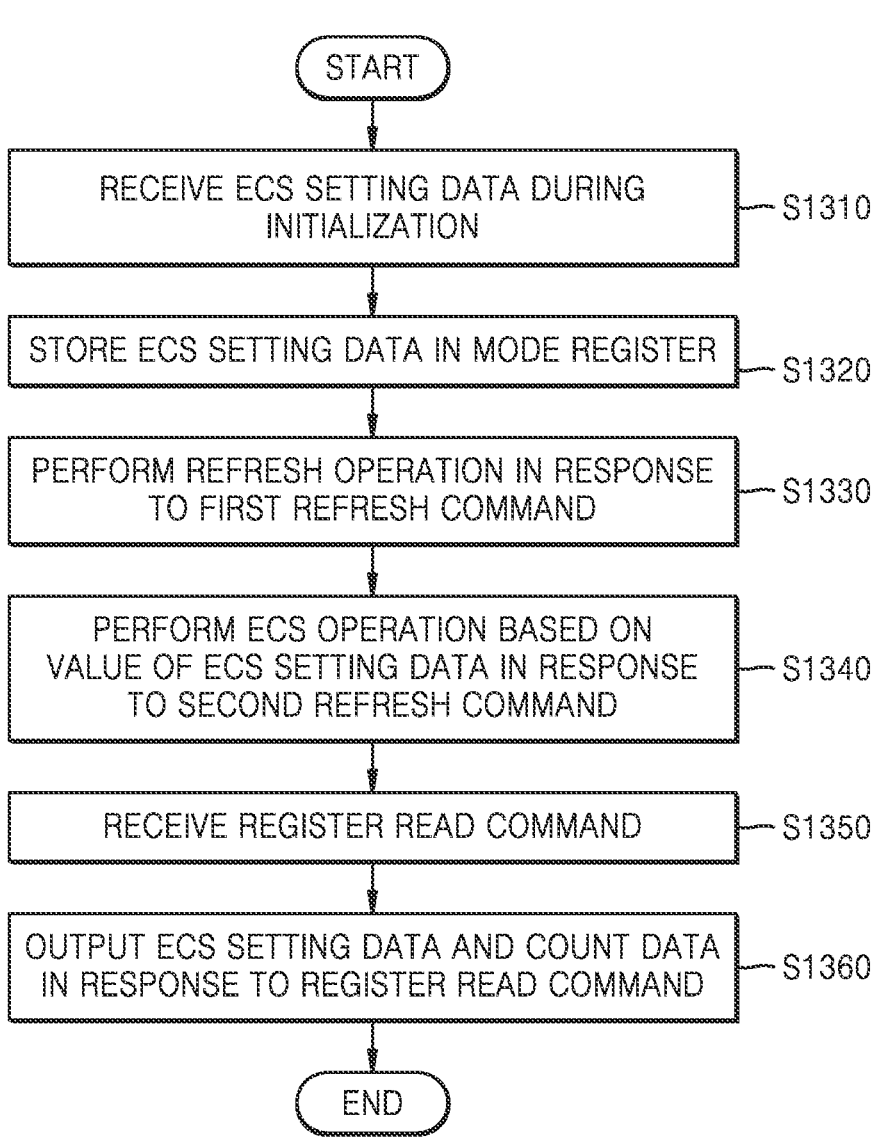
FIG. 13 is a flowchart illustrating an operation method of a memory device according to another embodiment.

FIG. 13 is a flowchart illustrating an operation method of a memory device according to another embodiment.

Referring to FIG. 13, operations S1310 to S1340 may be respectively the same as operations S1110 to S1140 shown in FIG. 11.

An operation of receiving a register read command from a memory controller is performed (S1350).

An operation of providing ECS setting data and count data to the memory controller in response to the register read command is performed (S1360). Here, the count data may be the error count data ECD.

Figure 14:
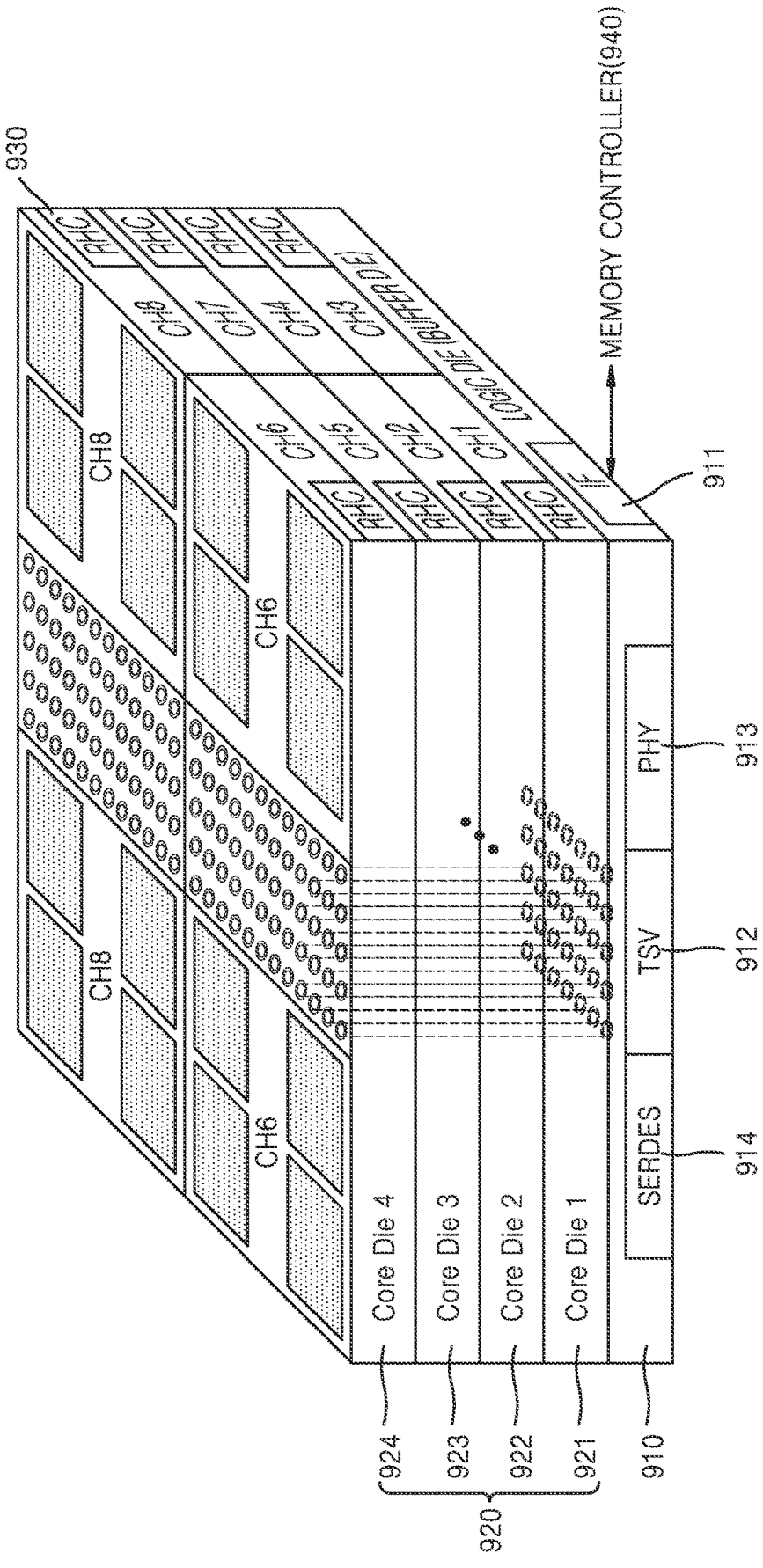
FIG. 14 is a diagram illustrating a memory device implemented as high bandwidth memory (HBM) according to an embodiment.

FIG. 14 is a diagram illustrating a memory device implemented as a high bandwidth memory (HBM) according to an embodiment.

Referring to FIG. 14, a memory device 20 may include an HBM and a memory controller 940. The HBM may use a HBM protocol of the JEDEC standard. The HBM protocol may be a high-performance random access memory interface for three-dimensional (3D) stack memories. The HBM may achieve a greater bandwidth while consuming less power, generally in a substantially smaller form factor than other DRAM technologies (e.g., DDR4, GDDR5, etc.).

The HBM may include a plurality of channels CH1 to CH8 having interfaces independent of each other, and may therefore have a high bandwidth. The HBM may include a plurality of dies 910 and 920. For example, the HBM may include a logic die (or buffer die) 910 and one or more core dies 920. The one or more core dies 920 may be stacked on a logic die 910. In FIG. 14, first to fourth core dies 921 to 924 may be included in the HBM, but the number of one or more core dies 920 may be changed in various ways. The one or more core dies 920 may be referred to as memory dies.

Each of the first to fourth core dies 921 to 924 may include one or more channels. For example, each of the first to fourth core dies 921 to 924 may include two channels, and the HBM may include eight channels CH1 to CH8. Specifically, for example, the first core die 921 may include the first channel CH1 and the third channel CH3, the second core die 922 may include the second channel CH2 and the fourth channel CH4, the third core die 923 may include the fifth channel CH5 and the seventh channel CH7, and the fourth core die 924 may include the sixth channel CH6 and the eighth channel CH8.

The logic die 910 may include an interface circuit 911 that communicates with a memory controller 940. The logic die 910 may receive a command/address and data from the memory controller 940 through an interface circuit 911.

The interface circuit 911 is a channel through which the memory controller 940 requests a memory operation or calculation process, and may transfer a command/address and data. Each of the core dies 920 or each of the channels CH1 to CH8 may include a processor-in-memory (PIM) circuit.

Each of the channels CH1 to CH8 may include a plurality of banks, and one or more processing devices may be provided in a PIM circuit of each channel. As an example, the number of processing devices in each channel may be equal to the number of banks. As the number of processing devices is less than the number of banks, one processing device may be shared by at least two banks. The PIM circuit of each channel may execute a kernel offloaded by the memory controller 940.

Each of the channels CH1 to CH8 may include a row hammer management circuit 930, a memory cell array, a mode register, a control logic circuit, and a refresh control circuit. Each of the channels CH1 to CH8 may further include an ECC circuit and an error counting register.

The logic die 910 may further include a through silicon via (TSV) region 912, an HBM physical layer interface (HBM PHY) region 913, and a serializer/deserializer (SERDES) region 914. The TSV region 912 is a region where TSVs for communication with the core dies 920 are formed, and bus(s) disposed corresponding to the channel(s) CH1 to CH8 are formed. When each of the channels CH1 to CH8 has a bandwidth of 128 bits, the TSVs may include components inputting/outputting data of 1024 bits.

The HBM PHY region 913 may include a plurality of input/output circuits for communication with the memory controller 940 and the channels CH1 to CH8. As an example, the HBM PHY region 913 may include one or more interconnect circuits for connecting the memory controller 940 and the channels CH1 to CH8. The HBM PHY region 913 may include a physical or electrical layer and a logical layer provided for signals, frequency, timing, driving, detailed operating parameters and functionality required for efficient communication between the memory controller 940 and the channels CH1 to CH8. The HBM PHY region 913 may perform memory interfacing such as selecting a row and a column corresponding to a memory cell with respect to a corresponding channel, writing data to a memory cell, or reading written data. The HBM PHY domain 913 may support features of the HBM protocol of the JEDEC standard.

The SERDES region 914 is a region that provides a SERDES interface of the JEDEC standard as the processing throughput of the processor(s) of the memory controller 940 increases and demands for memory bandwidth increase. The SERDES region 914 may include a SERDES transmitter portion, a SERDES receiver portion, and a controller portion. The SERDES transmitter portion includes a parallel-to-serial circuit and transmitter, and may receive parallel data streams and serialize received parallel data streams. The SERDES receiver portion includes a receiver amplifier, an equalizer, a clock and data recovery circuit, and a serial-to-parallel circuit, and may receive serial data streams and parallelize the received serial data streams. The controller portion may include an error detection circuit, an error correction circuit, and registers such as First In First Out (FIFO).

The memory controller 940 may transmit commands/addresses and data through bus(s) disposed corresponding to the channel(s) CH1 to CH8. In some embodiments, a bus may be divided for each channel, or a some buses may be shared by at least two channels.

The memory controller 940 may provide commands/addresses and data so that at least some of a plurality of operation tasks or kernels are performed by the memory device 20. Operation processing may be performed by the PIM circuit of a channel designated by the memory controller 940. In an example, when the received command/address instructs operation processing, the PIM circuit of the corresponding channel may perform operation processing using write data provided from the memory controller 940 and/or read data provided from the corresponding channel. In an example, when a command/address received through a corresponding channel of the memory device 20 instructs a memory operation, an access operation on the data may be performed.

Figure 15:
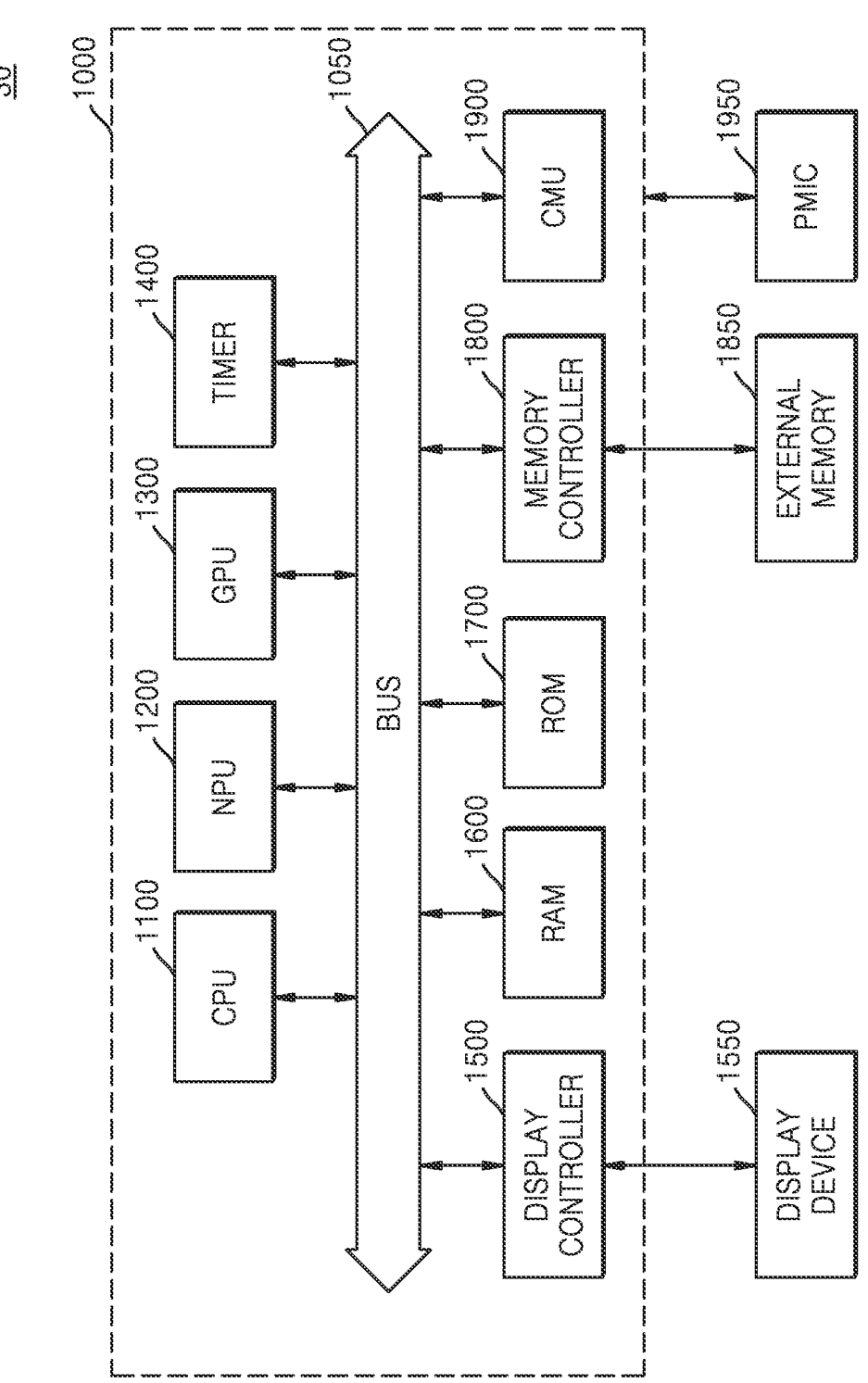
FIG. 15 is a block diagram illustrating an electronic device according to some embodiments.

FIG. 15 is a block diagram illustrating an electronic device according to some embodiments.

Referring to FIG. 15, an electronic device 30 may be a computing system such as a computer, a laptop computer, a server, a workstation, a portable communication terminal, a personal digital assistant (PDA), a portable multimedia player (PMP), a smart phone, and a wearable device.

The electronic device 30 may include a system-on-chip 1000, an external memory 1850, a display device 1550, and a power management integrated circuit (PMIC) 1950.

The system-on-chip 1000 may include a central processing unit (CPU) 1100, a neural processing unit (NPU) 1200, a graphics processing unit (GPU) 1300, a timer 1400, a display controller 1500, a random access memory (RAM) 1600, a read only memory (ROM) 1700, a memory controller 1800, a clock management unit (CMU) 1900, and a bus 1050. The system-on-chip 1000 may further include other components in addition to the illustrated components. For example, the electronic device 30 may further include a display device 1550, an external memory 1850, and a PMIC 1950. The PMIC 1950 may be implemented outside the system-on-chip 1000. However, the system-on-chip 1000 is not limited thereto, and may include a power management unit (PMU) capable of performing the function of the PMIC 1950.

The CPU 1100 may also be referred to as a processor, and may process or execute programs and/or data stored in the external memory 1850. For example, the CPU 1100 may process or execute programs and/or data in response to an operating clock signal output from the CMU 1900.

In some embodiments, the CPU 1100 may perform the method of setting the ECS setting value described above with reference to FIG. 9.

The CPU 1100 may be implemented as a multi-core processor. The multi-core processor is a computing component having two or more independent substantive processors (i.e., 'cores'), each of which may read and execute program instructions. Programs and/or data stored in the ROM 1700, the RAM 1600, and/or the external memory 1850 may be loaded into a memory of the CPU 1100 as needed.

The NPU 1200 may efficiently process a large-scale operation using an artificial neural network. The NPU 1200 may perform deep learning by supporting simultaneous matrix operations.

The GPU 1300 may convert read data read from external memory 1850 by the memory controller 1800 into a signal suitable for the display device 1550.

The timer 1400 may output a count value indicating time based on an operating clock signal output from the CMU 1900.

The display device 1550 may display image signals output from the display controller 1500. For example, the display device 1550 may be implemented as a liquid crystal display (LCD), a light emitting diode (LED) display, an organic LED (OLED) display, an active-matrix OLED (AMOLED) display, or a flexible display. The display controller 1500 may control the operation of the display device 1550.

The RAM 1600 may temporarily store programs, data, or instructions. For example, programs and/or data stored in the memory may be temporarily stored in the RAM 1600 under the control of the CPU 1100 or according to a booting code stored in the ROM 1700. The RAM 1600 may be implemented as a dynamic RAM (DRAM) or a static RAM (SRAM). The RAM 1600 may be referred to as volatile memory.

The ROM 1700 may permanently store programs and/or data. The ROM 1700 may be implemented as an erasable programmable read-only memory (EPROM) or an electrically erasable programmable read-only memory (EEPROM).

The memory controller 1800 may communicate with the external memory 1850 through an interface. The memory controller 1800 controls overall operations of the external memory 1850 and controls data exchange between the host and the external memory 1850. For example, the memory controller 1800 may write data to or read data from the external memory 1850 according to a request of a host. Here, the host may be a master device such as the CPU 1100, the GPU 1300, or the display controller 1500.

In some embodiments, the memory controller 1800 may store ECS setting data provided from the CPU 1100 in a volatile memory. Here, the volatile memory may be the RAM 1600 or the external memory 1850 implemented as a DRAM.

In some embodiments, the CPU 1100 may provide a first request signal requesting a mode setting value stored in a volatile memory to the memory controller 1800 in a normal state. The memory controller 1800 may provide a first mode register setting command to the volatile memory in response to the first request signal. In response to the first mode register setting command, the volatile memory may provide error count data indicating the number of occurrences of errors in the stored main data and ECS setting data to the memory controller 1800. The CPU 1100 may receive error count data and ECS setting data from the memory controller 1800, and based on the error count data and the ECS setting data, generate new ECS setting data changed according to the number of occurrences of errors. For example, when the number of occurrences of errors is greater than a reference number, the CPU 1100 may change a period value indicating the ECS period tECSW to a small value and change a current value of the refresh current IDD6 to a large value. For another example, when the number of occurrences of errors is less than or equal to the reference number, the CPU 1100 may change the period value indicating the ECS period tECSW to a large value and change the current value of the refresh current IDD6 to a small value. For another example, the CPU 1100 may change values related to the ECS period tECSW and the refresh current IDD6 corresponding to the number of occurrences of errors. The new ECS setting data may include ECS setting values changed according to the number of occurrences of errors.

In some embodiments, the CPU 1100 may provide the memory controller 1800 with a second request signal requesting to store the new ECS setting data. The memory controller 1800 may provide a second mode register setting command and the new ECS setting data to the volatile memory in response to the second request signal. The volatile memory may store the new ECS setting data in response to the second mode register setting command.

The external memory 1850 is a storage medium storing data, and may store an operating system (OS), various programs, and/or various data. The external memory 1850 may be, for example, the RAM 1600, but is not limited thereto. For example, the external memory 1850 may be a nonvolatile memory device (e.g., a flash memory, a phase change RAM (PRAM), a magnetic RAM (MRAM), a resistive RAM (RRAM), or a FeRAM device). In another embodiment, the external memory 1850 may be an embedded memory provided inside the system-on-chip 1000. Also, the external memory 1850 may be a flash memory, an embedded multimedia card (eMMC), or universal flash storage (UFS).

The CMU 1900 generates an operating clock signal. The CMU 1900 may include a clock signal generator such as a phase locked loop (PLL), a delayed locked loop (DLL), or a crystal oscillator.

The operating clock signal may be supplied to the GPU 1300. The operating clock signal may be supplied to other components (e.g., the CPU 1100 or the memory controller 1800). The CMU 1900 may change the frequency of the operating clock signal.

Each of the CPU 1100, the NPU 1200, the GPU 1300, the timer 1400, the display controller 1500, the RAM 1600, the ROM 1700, the memory controller 1800, and the CMU 1900 may communicate with each other via a bus 1050.

Figure 16:
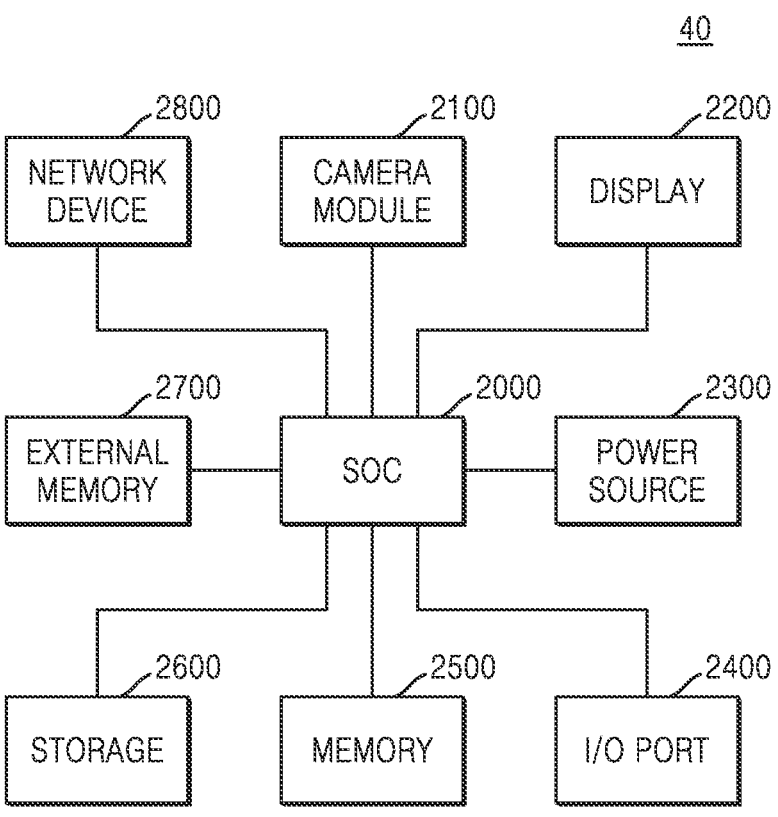
FIG. 16 is a block diagram illustrating an electronic system according to some embodiments.

FIG. 16 is a block diagram illustrating an electronic system according to some embodiments.

Referring to FIG. 16, an electronic system 40 may be implemented as a personal computer (PC), a data server, or a portable electronic device.

The electronic system 40 may include a system-on-chip 2000, a camera module 2100, a display 2200, a power source 2300, an input/output port 2400, a memory 2500, a storage 2600, an external memory 2700, and a network device 2800.

The camera module 2100 refers to a module capable of converting an optical image into an electrical image. Accordingly, the electrical image output from the camera module 2100 may be stored in the storage 2600, the memory

2500, or the external memory 2700. Also, the electrical image output from the camera module 2100 may be displayed on the display 2200.

The display 2200 may display data output from the storage 2600, the memory 2500, the input/output port 2400, the external memory 2700, or the network device 2800. The display 2200 may be the display device 1550 shown in FIG. 10.

The power source 2300 may supply an operating voltage to at least one of the components. The power source 2300 may be controlled by a PMIC.

The input/output port 2400 refers to ports capable of transmitting data to the electronic system 40 or data output from the electronic system 40 to an external device. For example, the input/output port 2400 may be a port connecting to a pointing device such as a computer mouse, a port connecting to a printer, or a port connecting to a USB drive.

The memory 2500 may be implemented as a volatile memory or a non-volatile memory. According to an embodiment, a memory controller capable of controlling a data access operation on the memory 2500, for example, a read operation, a write operation (or a program operation), or an erase operation, may be integrated or embedded in the system-on-chip 2000. Hereinafter, it is assumed that the memory 2500 is implemented as a volatile memory.

In some embodiments, the system-on-chip 2000 may provide a first mode register setting command including ECS setting data to the memory 2500 in an initialization state of the electronic system 40. The ECS setting data may be the same as described above with reference to FIG. 10. The memory 2500 may store the ECS setting data in response to the first mode register setting command provided from the system-on-chip 2000.

In some embodiments, the system-on-chip 2000 may provide a second mode register setting command instructing the memory 2500 to output a mode setting value stored in the volatile memory in a normal state. The memory 2500 may provide the system-on-chip 2000 with error count data indicating the number of occurrences of errors in the main data stored in the memory 2500 and the ECS setting data in response to the second mode register setting command.

In some embodiments, the system-on-chip 2000 may generate new ECS setting data changed according to the number of occurrences of errors based on the error count data and the ECS setting data. In addition, the system-on-chip 2000 may provide a third mode register setting command instructing the memory 2500 to store new ECS setting data. The memory 2500 may store the new ECS setting data in response to the third mode register setting command.

The storage 2600 may be implemented as a hard disk drive or a solid state drive (SSD).

The external memory 2700 may be implemented as a secure digital (SD) card or a multimedia card (MMC). According to embodiments, the external memory 2700 may be a subscriber identification module (SIM) card or a universal subscriber identity module (USIM) card.

The network device 2800 refers to a device capable of connecting the electronic system 40 to a wired network or a wireless network.

In some embodiments, each of the components represented by a block as illustrated in FIGS. 1-7, 15 and 16 may be implemented as various numbers of hardware, software and/or firmware structures that execute respective functions described above, according to embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of embodiments may be implemented in algorithms that execute on one or more processors. Furthermore, the components, elements, modules or units represented by a block or processing steps may employ any number of related art techniques for electronics configuration, signal processing and/or control, data processing and the like.

It is apparent to those skilled in the art that the structure may be modified or changed in various ways without departing from the scope or spirit of the inventive concept. In view of the description provided above, the inventive concept is deemed to include changes and modifications of the disclosure provided that such modifications and variations changes and modifications fall within the scope of the following claims and equivalents.

While aspects of embodiments have been particularly shown and described, it will be understood that various changes in form and details may be made therein without departing from the spirit and scope of the following claims.

What is claimed is:

1. A memory device comprising:
a memory cell array comprising a plurality of memory cell rows;
a refresh control circuit configured to output a refresh row address to control a refresh operation to be performed on at least one memory cell row among the plurality of memory cell rows; and
a control logic circuit configured to receive, from a memory controller, error check and scrub (ECS) setting data corresponding to a mode among a plurality of modes, store the ECS setting data in a mode register, and provide a target row address of a memory cell row to be refreshed to the refresh control circuit based on a value of the ECS setting data in response to a refresh command provided from the memory controller, wherein the ECS setting data comprises a current value related to a refresh current used in the refresh operation.

2. The memory device of claim 1, wherein when a first period value included in first ECS setting data is less than a second period value included in second ECS setting data, a first current value included in the first ECS setting data is greater than a second current value included in the second ECS setting data, and
wherein when the first period value is greater than the second period value, the first current value is less than the second current value.

3. The memory device of claim 1, wherein the ECS setting data further comprises data indicating a level of a supply voltage supplied to the memory device in dynamic voltage frequency scaling (DVFS).

4. The memory device of claim 1, further comprising:
an error correction code (ECC) circuit configured to perform ECC decoding on data read out from the memory cell array, and output to the control logic circuit an error occurrence signal indicating that an error is present in the data; and
an error counting register,
wherein the control logic circuit is further configured to count the error occurrence signal and store error count data indicating a number of occurrences of errors in the error counting register.

5. The memory device of claim 4, wherein the control logic circuit is further configured to provide the ECS setting data and the error count data to the memory controller, in response to a register read command received from the memory controller.

6. The memory device of claim 5, wherein the control logic circuit is further configured to:
receive, from the memory controller, new ECS setting data determined according to the number of occurrences of errors, and
store the new ECS setting data in the mode register.

7. The memory device of claim 6, wherein the new ECS setting data comprises a new period value indicating a new ECS period at which an ECS operation is performed in the refresh operation and a new current value related to the refresh current used in the refresh operation, and
wherein the memory controller is further configured to determine the new period value and the new current value according to the number of occurrences of errors.

* * * * *